(12) United States Patent
Umeyama

(10) Patent No.: US 9,252,750 B2
(45) Date of Patent: Feb. 2, 2016

(54) SEMICONDUCTOR INTEGRATED CIRCUIT AND OPERATING METHOD THEREOF

(71) Applicant: Renesas Electronics Corporation, Kawasaki-shi (JP)

(72) Inventor: Takehiko Umeyama, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 104 days.

(21) Appl. No.: 14/255,758

(22) Filed: Apr. 17, 2014

(65) Prior Publication Data
US 2014/0346878 A1    Nov. 27, 2014

(30) Foreign Application Priority Data
May 21, 2013    (JP) ................ 2013-106932

(51) Int. Cl.
| H03K 3/012 | (2006.01) |
| G06F 1/26 | (2006.01) |
| H01H 31/10 | (2006.01) |
| H03K 3/356 | (2006.01) |
| H03K 5/24 | (2006.01) |

(52) U.S. Cl.
CPC ............ *H03K 3/012* (2013.01); *G06F 1/263* (2013.01); *H03K 3/356104* (2013.01); *H03K 5/2481* (2013.01); *Y10T 307/549* (2015.04)

(58) Field of Classification Search
USPC .................................................. 307/115
See application file for complete search history.

(56) References Cited

FOREIGN PATENT DOCUMENTS

| JP | 05-276688 A | 10/1993 |
| JP | 11-252825 A | 9/1999 |

*Primary Examiner* — Robert Deberadinis
(74) *Attorney, Agent, or Firm* — McGinn IP Law Group, PLLC

(57) ABSTRACT

The present invention is made to not only reduce voltage drop when a power supply circuit makes a selection between a power supply voltage from a main power supply and a backup power supply voltage from an auxiliary power supply, but also reduce the power consumption of the auxiliary power supply. The power supply circuit, which is in a semiconductor integrated circuit, includes a measurement circuit, a switch control circuit, and a switch circuit. The switch circuit includes a first switch element and a second switch element. The first switch element is coupled between an output terminal and a first input terminal. The second switch element is coupled between the output terminal and a second input terminal. The measurement circuit operates on the main power supply voltage at the first input terminal and compares the main power supply voltage with the auxiliary power supply voltage.

20 Claims, 14 Drawing Sheets

SEMICONDUCTOR INTEGRATED CIRCUIT AND OPERATING METHOD THEREOF

CROSS-REFERENCE TO RELATED APPLICATIONS

The present application claims priority from Japanese Patent Application JP 2013-106932 filed on May 21, 2013, the content of which is hereby incorporated by reference into this application.

BACKGROUND

The present invention relates to a semiconductor integrated circuit having a power supply circuit and to a method of operating the semiconductor integrated circuit. More specifically, the present invention relates to a technology that is effective not only for reducing voltage drop when the power supply circuit makes a selection between a power supply voltage from a main power supply and a backup power supply voltage from an auxiliary power supply, but also for reducing the power consumption of the auxiliary power supply.

It is conventionally known that a backup power supply voltage from an auxiliary power supply is supplied to an electronic device in order to maintain the supply of power to the electronic device even in the event of a decrease in a power supply voltage from a main power supply that supplies electrical power to the electronic device.

According to Japanese Patent Laid-open No. Hei 11 (1999)-252825, a power supply voltage from a main power supply formed of an automotive battery is supplied to an electronic device through a first backflow prevention diode and a backup power supply voltage from an auxiliary power supply formed of an auxiliary battery is supplied to the electronic device through a second backflow prevention diode. The power supply voltage from the main power supply formed of the automotive battery is supplied to the anode of the first backflow prevention diode. The backup power supply voltage from the auxiliary power supply formed of the auxiliary battery is supplied to the anode of the second backflow prevention diode. The cathode of the first backflow prevention diode and the cathode of the second backflow prevention diode are commonly coupled and further coupled to the electronic device.

According to Japanese Patent Laid-open No. Hei 5 (1993)-276688, a power supply voltage from a main power supply formed of an AC adapter is supplied to a DC-to-DC converter and a load through a backflow prevention diode and a power switch, and a backup power supply voltage from an auxiliary power supply formed of a secondary battery is supplied to the DC-to-DC converter and the load through a MOS transistor and the power switch. As a charge circuit is coupled between the auxiliary power supply and the main power supply formed of the AC adapter, the secondary battery of the auxiliary power supply is charged by the charge circuit. The gate of the MOS transistor coupled to the output terminal of a comparator. A voltage obtained when the power supply voltage from the main power supply is divided by two voltage divider resistors is supplied to the non-inverting input terminal of the comparator. A reference voltage, which is generated by a reference voltage circuit formed of a resistor and a Zener diode from a power supply voltage supplied to the DC-to-DC converter and the load through the backflow prevention diode and the power switch, is supplied to the inverting input terminal of the comparator. Therefore, if the AC adapter is shut off from an AC power supply, the backflow prevention diode turns off. Thus, the divided voltage derived from the two voltage divider resistors becomes lower than the reference voltage of the reference voltage circuit. This turns on the MOS transistor. As a result, the secondary battery supplies a DC voltage to the DC-to-DC converter and the load through the drain-source path of the MOS transistor.

SUMMARY

Before the disclosure of the present invention, inventors of the present invention were engaged in the development of a power supply circuit that selectively supplies a power supply voltage of a main power supply and a backup power supply voltage of an auxiliary power supply to an internal circuit in a semiconductor integrated circuit from the outside of the semiconductor integrated circuit.

During the development of the above-mentioned power supply circuit, the inventors studied a technology described in Japanese Patent Laid-open No. Hei 11 (1999)-252825 and a technology described in Japanese Patent Laid-open No. Hei 5 (1993)-276688, which have been explained under BACKGROUND.

According to the technology described in Japanese Patent Laid-open No. Hei 11 (1999)-252825, the power supply voltage of the main power supply is supplied to the electronic device through the first backflow prevention diode, and the backup power supply from the auxiliary power supply is supplied to the electronic device through the second backflow prevention diode. The studies conducted by the inventors before the disclosure of the present invention indicate that a great forward voltage drop $V_F$ of approximately 0.7 V occurs across the first and second backflow prevention diodes when a forward current flows to the first and second backflow prevention diodes in a situation where the first and second backflow prevention diodes are formed of a silicon PN junction. Hence, the studies conducted by the inventors before the disclosure of the present invention indicate a problem in which the voltage supplied to the load is reduced to 2.3 V (=3.0 V−0.7 V) when a lithium battery having a voltage of approximately 3.0 V is used as the auxiliary power supply. Additional studies were also conducted by the inventors before the disclosure of the present invention in order to compare the first and second backflow prevention diodes with a PN junction diode by using a Schottky barrier formed through the contact between a metal and a semiconductor and investigate the use of a Schottky barrier diode (SBD), which exhibits a small forward voltage drop $V_F$. To achieve a small forward voltage drop $V_F$, however, it is necessary to use a special metal as a barrier metal that forms the Schottky barrier. This complicates a process of manufacturing a semiconductor integrated circuit having a built-in power supply circuit including the first and second backflow prevention diodes. Hence, there arises a problem in which the manufacturing cost of the semiconductor integrated circuit increases. Further, the studies conducted by the inventors before the disclosure of the present invention also indicate a problem in which a leakage current (reverse current) encountered when a reverse voltage is applied to the Schottky barrier diode is larger than when a reverse voltage is applied to the PN junction diode.

According to the technology described in Japanese Patent Laid-open No. Hei 5 (1993)-276688, the backup power supply voltage from the auxiliary power supply is supplied to the DC-to-DC converter and the load through the MOS transistor. The studies conducted by the inventors before the disclosure of the present invention indicate that a voltage drop in the drain-source path of the MOS transistor can be set to a voltage as low as approximately 0.2 V when a sufficiently great source-gate potential difference is set with the element size of the MOS transistor enlarged. Therefore, when a lithium battery having a voltage of approximately 3.0 V is used as the auxiliary power supply, a sufficiently high voltage of 2.8 V (=3.0 V−0.2 V) can be supplied to the load. However, the studies conducted by the inventors before the disclosure of the present invention indicate a problem in which, if the AC adapter is shut off from the AC power supply during the use of the technology described in Japanese Patent Laid-open No. Hei 5 (1993)-276688, the secondary battery used as the auxiliary battery is significantly drained because a DC current continuously flows from the secondary battery to the reference voltage circuit formed of a resistor and a Zener diode through the drain-source path of the MOS transistor. Further, the studies conducted by the inventors before the disclosure of the present invention also indicate a problem in which, when the technology described in Japanese Patent Laid-open No. Hei 5 (1993)-276688 is used, the secondary battery used as the auxiliary battery is further drained because an operating power supply voltage for the comparator also needs to be supplied from the secondary battery.

Means for addressing the above problem will be described below. Other problems and novel features will become apparent from the following description and from the accompanying drawings.

The following is a brief description of a representative aspect of the present invention disclosed in this document.

According to the representative aspect of the present invention, there is provided a semiconductor integrated circuit including a power supply circuit (100) having a first input terminal, a second input terminal, and an output terminal (230).

A main power supply voltage (VM) of a main power supply (210) is supplied to the first input terminal. An auxiliary power supply voltage (VB) of an auxiliary power supply (220) is supplied to the second input terminal. An output power supply voltage (VOUT) generated from the output terminal (230) is supplied to a load (300).

The power supply circuit (100) includes a measurement circuit (110), a switch control circuit (120), and a switch circuit (130). The switch circuit (130) includes a first switch element (M3m) and a second switch element (M3b). The first switch element (M3m) is coupled between the first input terminal and the output terminal (230). The second switch element (M3b) is coupled between the second input terminal and the output terminal (230). The measurement circuit (110) operates on the main power supply voltage (VM) supplied to the first input terminal and compares the main power supply voltage (VM) with the auxiliary power supply voltage (VB). In response to a determination signal (SD) of the measurement circuit (110), the switch control circuit (120) controls the first switch element (M3m) and second switch element (M3b) in the switch circuit (130).

When the main power supply voltage (VM) is lower than the auxiliary power supply voltage (VB), control is made in response to the determination signal (SD) of the measurement circuit (110) so that the first switch element (M3m) and second switch element (M3b) in the switch circuit (130) are placed in an OFF state and an ON state, respectively (see FIG. 1).

The following is a brief description of an advantageous effect achievable by the representative aspect of the present invention disclosed in this document.

The semiconductor integrated circuit (100) makes it possible to not only reduce voltage drop when the power supply circuit makes a selection between the power supply voltage of the main power supply and the backup power supply voltage from the auxiliary power supply, but also reduce the power consumption of the auxiliary power supply.

DETAILED DESCRIPTION

1. Summary of the Embodiments

Figure 1:
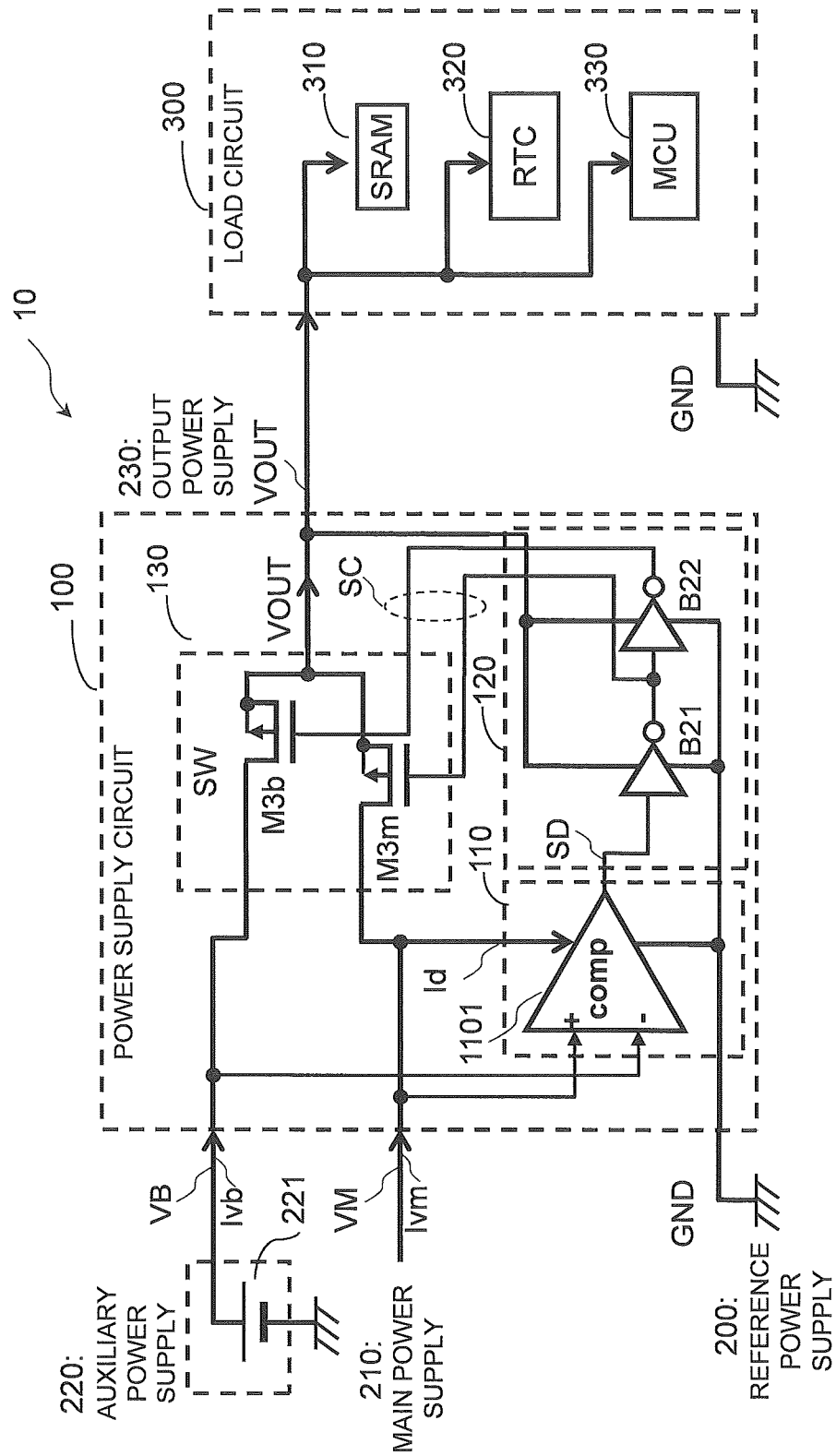
FIG. 1 is a diagram illustrating a configuration of an electronic device having a power supply circuit according to a first embodiment of the present invention.

First of all, representative embodiments of the present invention disclosed in this document will be summarized. The parenthesized reference numerals in the accompanying drawings referred to in the summary of the representative embodiments merely illustrate what is contained in the concept of elements to which the reference numerals are affixed.

[1] According to a representative embodiment, there is provided a semiconductor integrated circuit including a power supply circuit (100) having a first input terminal, a second input terminal, and an output terminal (230).

A main power supply voltage (VM) from a main power supply (210) can be supplied to the first input terminal. An auxiliary power supply voltage (VB) from an auxiliary power supply (220) can be supplied to the second input terminal. An output power supply voltage (VOUT) generated from the output terminal (230) can be supplied to a load (300).

The power supply circuit (100) includes a measurement circuit (110), a switch control circuit (120), and a switch circuit (130).

The switch circuit (130) includes a first switch element (M3*m*) and a second switch element (M3*b*). The first switch element (M3*m*) is coupled between the first input terminal and the output terminal (230). The second switch element (M3*b*) is coupled between the second input terminal and the output terminal (230).

The measurement circuit (110) operates on the main power supply voltage (VM) supplied to the first input terminal and compares the main power supply voltage (VM) supplied to the first input terminal with the auxiliary power supply voltage (VB) supplied to the second input terminal.

In response to a determination signal (SD) of the measurement circuit (110), the switch control circuit (120) controls the first switch element (M3*m*) and second switch element (M3*b*) in the switch circuit (130).

When the main power supply voltage (VM) supplied to the first input terminal is higher than the auxiliary power supply voltage (VB) supplied to the second input terminal, control is made in response to the determination signal (SD) of the measurement circuit (110) so that the first switch element (M3*m*) and second switch element (M3*b*) in the switch circuit (130) are placed in an ON state and an OFF state, respectively.

When the main power supply voltage (VM) supplied to the first input terminal is lower than the auxiliary power supply voltage (VB) supplied to the second input terminal, control is made in response to the determination signal (SD) of the measurement circuit (110) so that the first switch element (M3*m*) and second switch element (M3*b*) in the switch circuit (130) are placed in the OFF state and the ON state, respectively (see FIG. 1).

The above-described embodiment makes it possible to not only reduce voltage drop when the power supply circuit makes a selection between the power supply voltage of the main power supply and the backup power supply voltage from the auxiliary power supply, but also reduce the power consumption of the auxiliary power supply.

In a preferred embodiment, the measurement circuit (110) includes a comparator (1101) that operates on the main power supply voltage (VM) supplied to the first input terminal and compares the main power supply voltage (VM) supplied to the first input terminal with the auxiliary power supply voltage (VB) supplied to the second input terminal.

The determination signal (SD) of the measurement circuit (110) is generated from an output terminal of the comparator (1101) (see FIG. 1).

In another preferred embodiment, the first switch element (M3*m*), which is coupled between the first input terminal and the output terminal (230) and included in the switch circuit (130), has such a configuration as to prevent a backflow from the output terminal (230) to the first input terminal.

The second switch element (M3*b*), which is coupled between the second input terminal and the output terminal (230) and included in the switch circuit (130), has such a configuration as to prevent a backflow from the output terminal (230) to the second input terminal (see FIGS. 1, 2, 3, and 4).

In a still another preferred embodiment, the first and second switch elements in the switch circuit (130) include a first MOS transistor (M3*m*) and a second MOS transistor (M3*b*), respectively.

Figure 2:
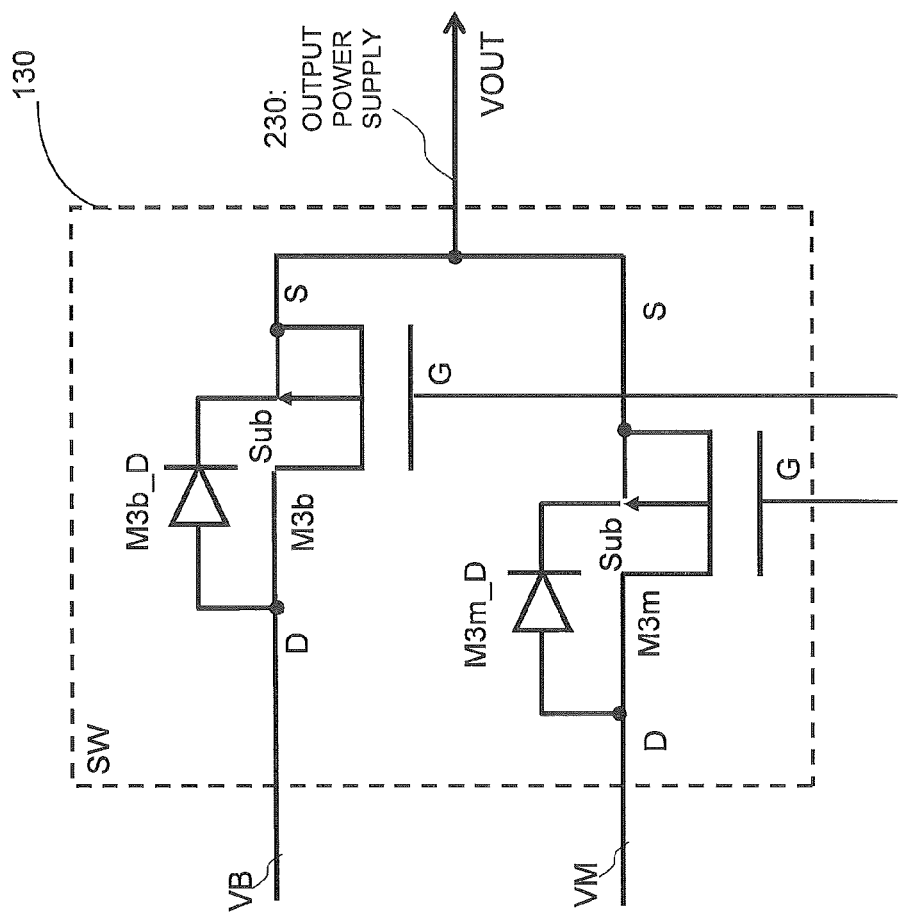
FIG. 2 is a diagram illustrating how backflow prevention is provided by first and second P-channel MOS transistors of a switch (SW) circuit in the power supply circuit according to the first embodiment, which is depicted in FIG. 1.
Figure 3:
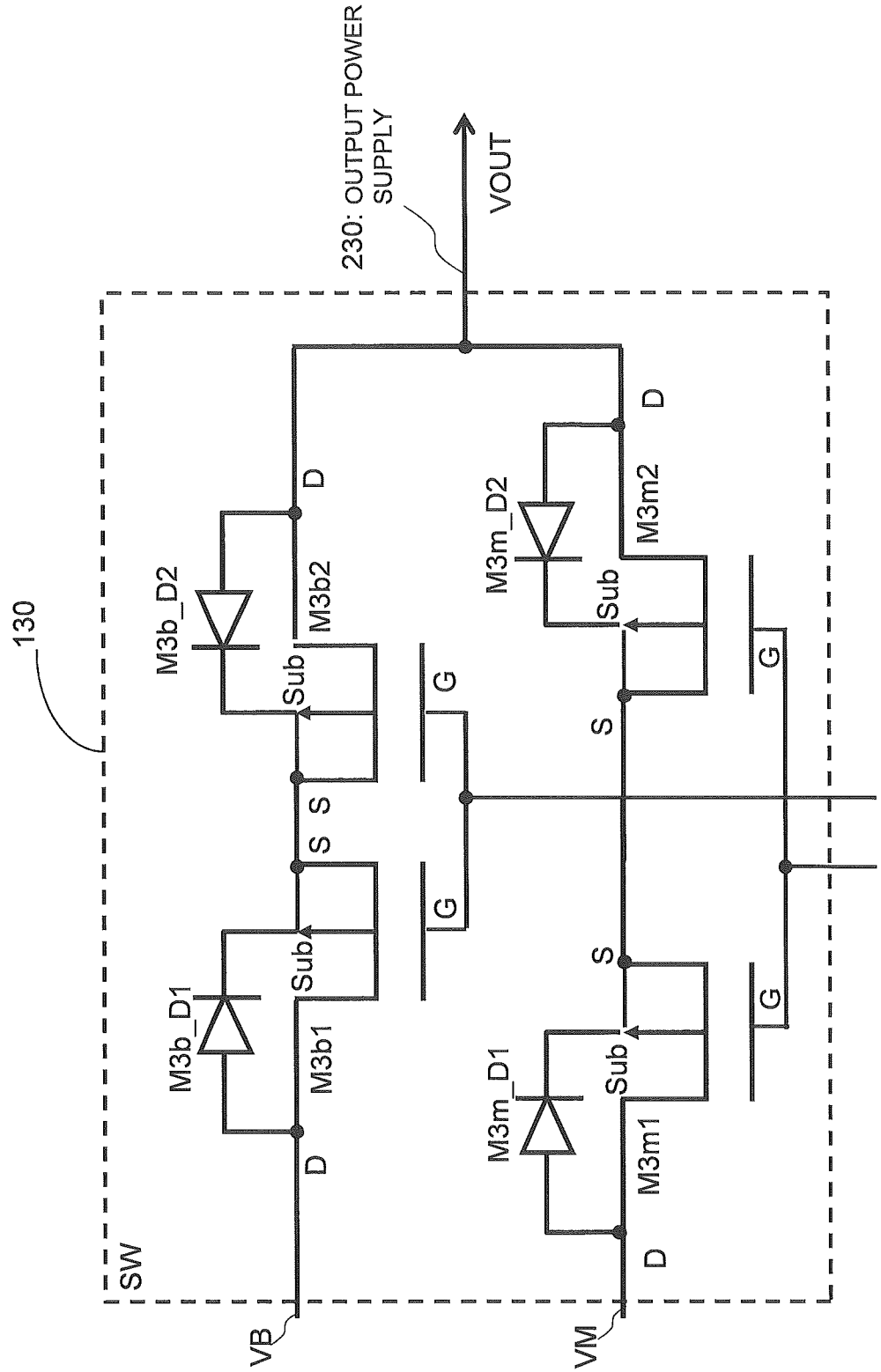
FIG. 3 is a diagram illustrating another configuration of the switch (SW) circuit that provides backflow prevention and is included in the power supply circuit according to the first embodiment, which is depicted in FIG. 1.
Figure 4:
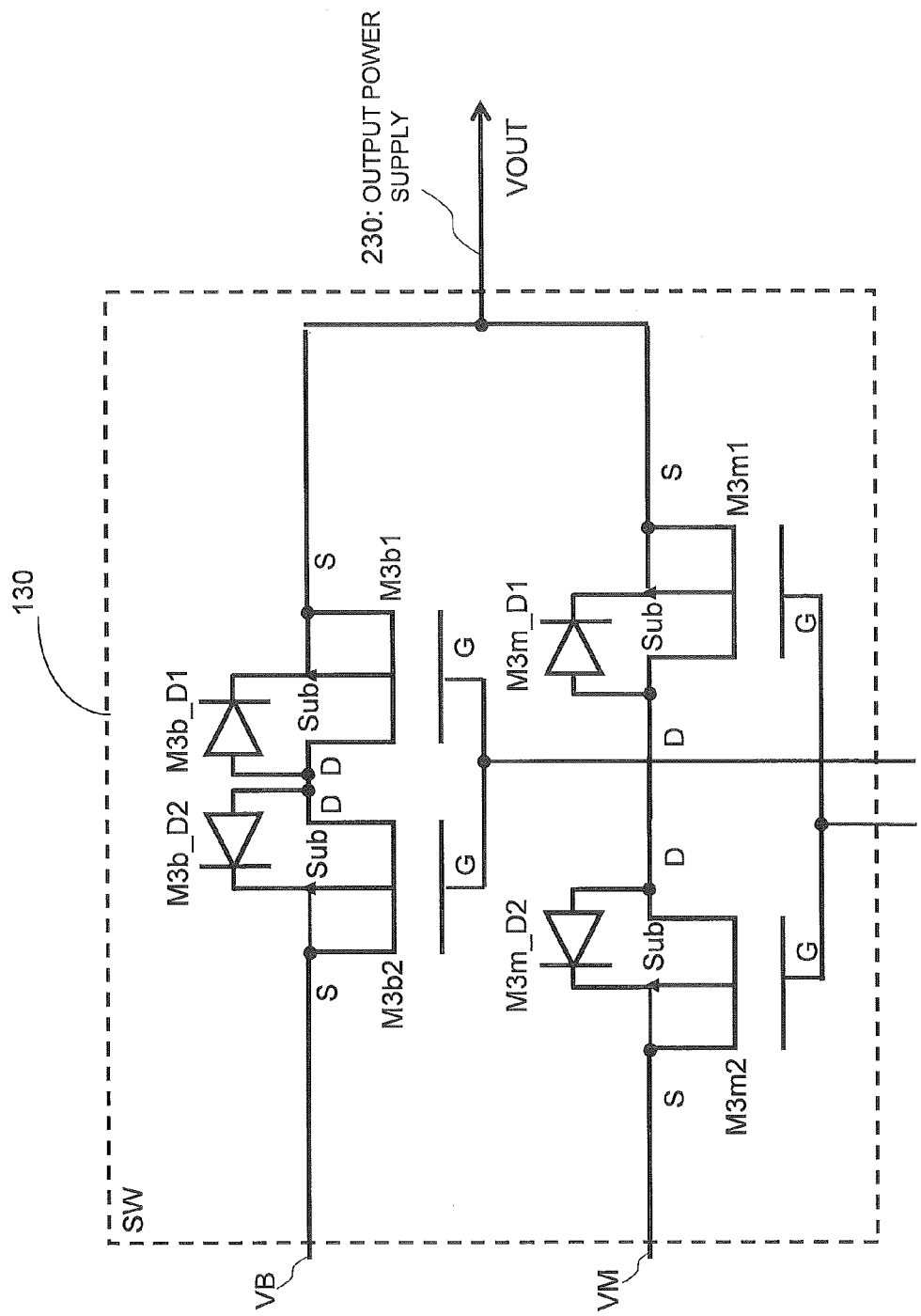
FIG. 4 is a diagram illustrating still another configuration of the switch (SW) circuit that provides backflow prevention and is included in the power supply circuit according to the first embodiment, which is depicted in FIG. 1.

The configuration for preventing the backflow from the output terminal to the first input terminal and the configuration for preventing the backflow from the output terminal to the second input terminal respectively include a parasitic diode between the drain and substrate of the first MOS transistor and a parasitic diode between the drain and substrate of the second MOS transistor (see FIGS. 2, 3, and 4).

In a more preferred embodiment, the load (300) to which the output power supply voltage (VOUT) generated from the output terminal (230) of the power supply circuit (100) is supplied includes internal core circuits (310, 320, 330).

Figure 5:
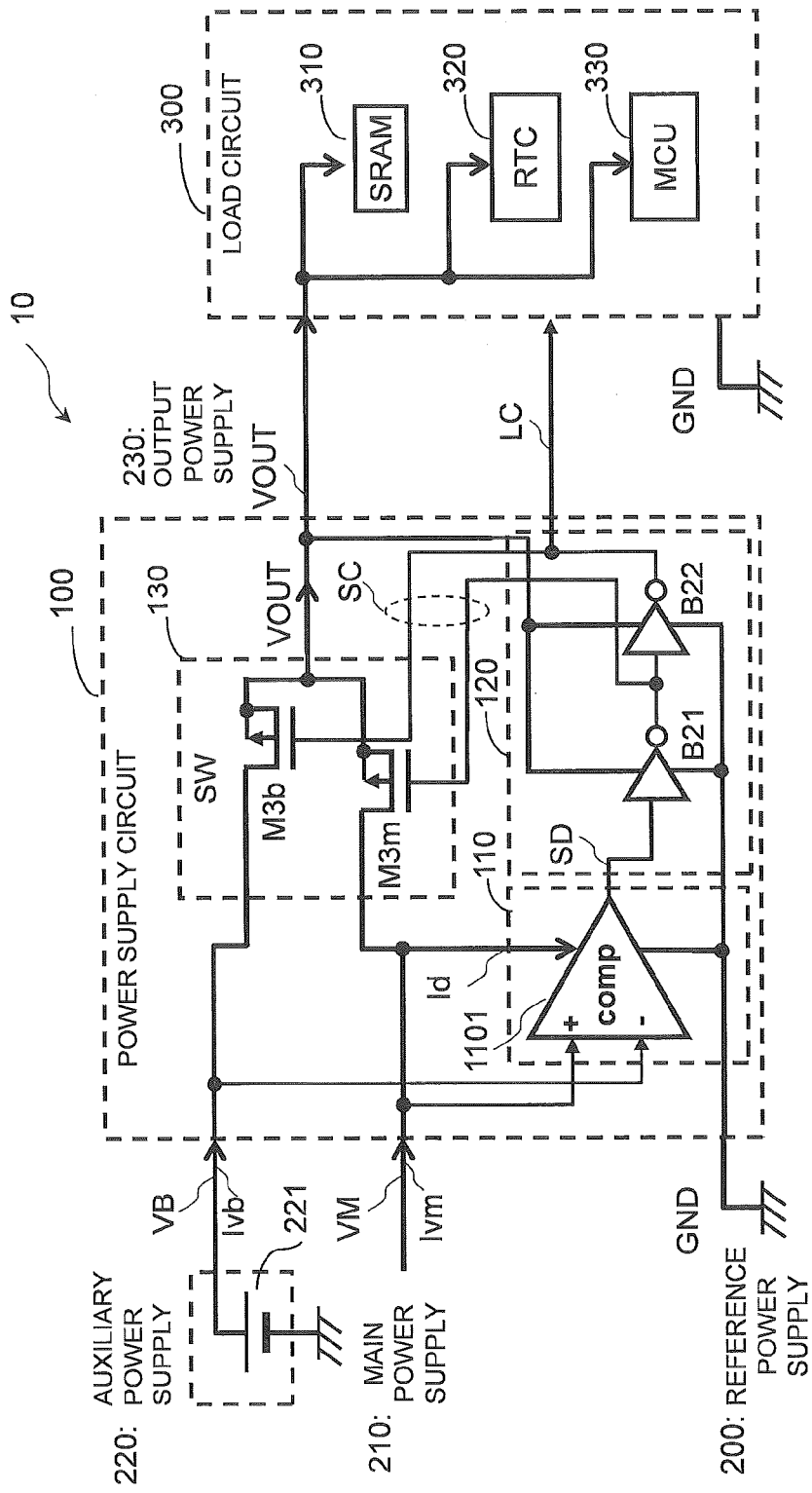
FIG. 5 is a diagram illustrating an alternative configuration of the electronic device having the power supply circuit according to the first embodiment.

When the main power supply voltage (VM) supplied to the first input terminal is lower than the auxiliary power supply voltage (VB) supplied to the second input terminal, a load control signal (LC) supplied from the power supply circuit (100) to the load (300) in response to the determination signal (SD) of the measurement circuit (110) performs control to place the internal core circuits in a low power consumption mode (see FIG. 5).

In another more preferred embodiment, the switch control circuit (120) includes a first inverter (B21) and a second inverter (B22). The determination signal (SD) of the measurement circuit (110) is supplied to the input terminal of the first inverter (B21). The output signal of the first inverter (B21) is supplied to the input terminal of the second inverter (B22).

The first MOS transistor (M3*m*) of the first switch element in the switch circuit (130) and the second MOS transistor (M3*b*) of the second switch element in the switch circuit (130) are P-channel MOS transistors.

The gate of the first MOS transistor in the switch circuit and the gate of the second MOS transistor in the switch circuit are respectively driven by the output signal of the first inverter in the switch control circuit and the output signal of the second inverter in the switch control circuit (see FIGS. 1, 5, 8, 9, 10, 12, 13, and 14).

In yet another more preferred embodiment, the switch control circuit controls the first and second switch elements of the switch circuit to be OFF state and the ON state, respectively, when the main power supply voltage supplied to the first input terminal drops below an operating lower limit voltage (VMMin) of the comparator (1101) (see FIGS. 8, 9, 10, 12, and 13).

In still another more preferred embodiment, the switch control circuit (120) further includes an N-channel control MOS transistor (M23) whose drain-source path is coupled between the first inverter and a reference potential (GND).

When the main power supply voltage supplied to the first input terminal drops below the operating lower limit voltage of the comparator (1101), control is made so as to place the N-channel Control MOS transistor (M23) in the OFF state and place the first and second switch elements of the switch circuit in the OFF state and the ON state, respectively (see FIGS. 8, 12, and 13).

In an additional more preferred embodiment, the measurement circuit (110) further includes another comparator (1102) that operates on the main power supply voltage (VM) supplied to the first input terminal and detects that the main power supply voltage supplied to the first input terminal is lower than the operating lower limit voltage (VMMin) of the earlier-mentioned comparator.

The switch control circuit (120) further includes a two-input AND gate (A21) having a first input terminal, a second input terminal, and an output terminal.

The output signal of the earlier-mentioned comparator (1101) in the measurement circuit (110) and the output signal of the other comparator (1102) in the measurement circuit (110) are respectively supplied to the first and second input terminals of the two-input AND gate (A21) of the switch control circuit (120).

The output terminal of the two-input AND gate (A21) of the switch control circuit (120) is coupled to the input terminal of the first inverter (B21) (see FIGS. 9, 10, 12, and 13).

In a specific embodiment, the power supply circuit (100) further includes a level-shift circuit (1104) that is coupled between the measurement circuit (110) and the switch control circuit (120).

The main power supply voltage (VM) supplied to the first input terminal of the power supply circuit (100) and the output power supply voltage (VOUT) generated from the output terminal (230) of the power supply circuit (100) are supplied to the level-shift circuit (1104) as a power supply voltage.

The output signal of the earlier-mentioned comparator (1101) in the measurement circuit (110) and the output signal of the other comparator (1102) in the measurement circuit (110) are respectively supplied to first and second input terminals of the level-shift circuit (1104).

First and second output terminals of the level-shift circuit (1104) are respectively coupled to the first and second input terminals of the two-input AND gate (A21) of the switch control circuit (120).

The level-shift circuit is capable of converting high-level input signals supplied respectively to the first and second input terminals of the level-shift circuit to high-level level-shift output signals, which are respectively generated at the first and second output terminals of the level-shift circuit.

The high-level input signals supplied respectively to the first and second input terminals of the level-shift circuit have the voltage level of the main power supply voltage supplied to the first input terminal.

Figure 10:
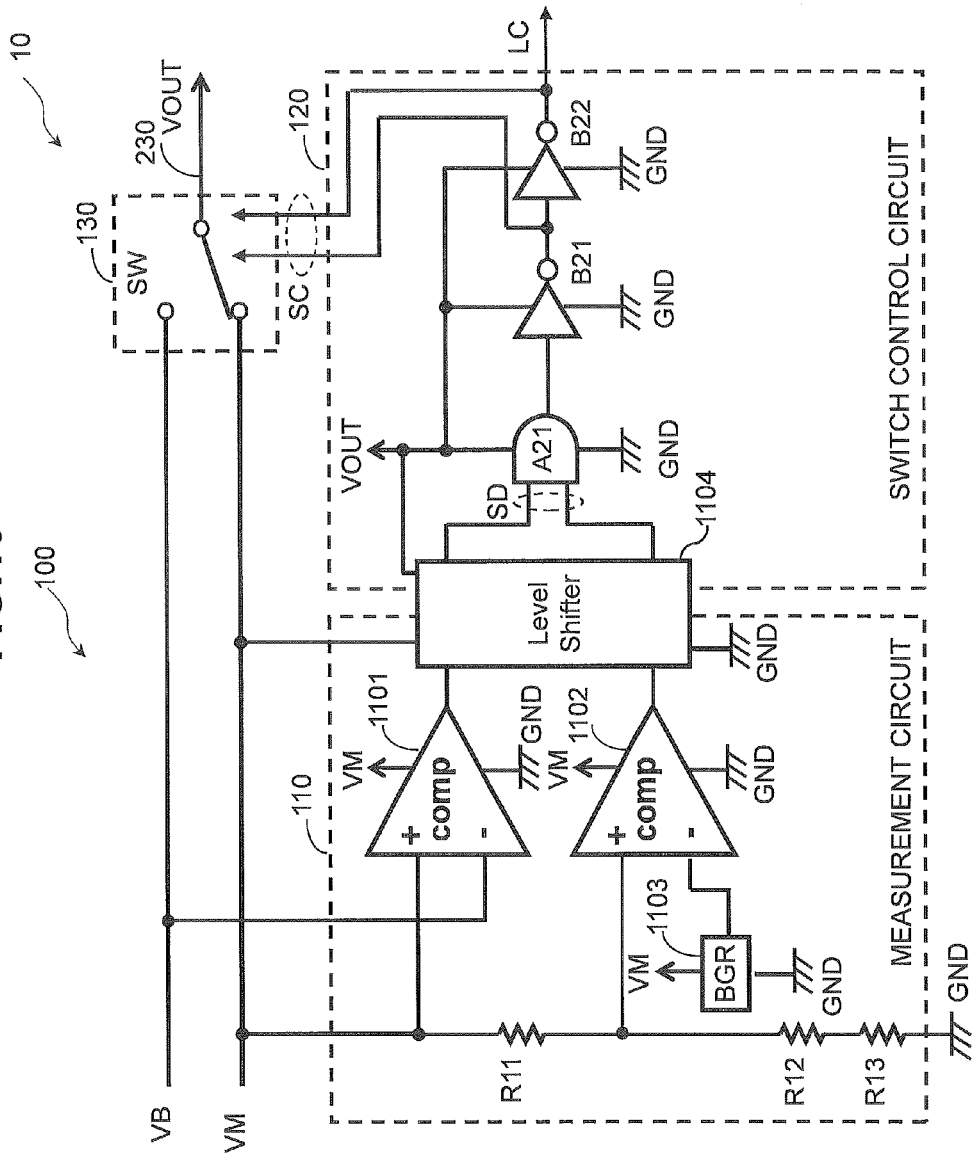
FIG. 10 is a diagram illustrating the configuration of the power supply circuit according to a fourth embodiment of the present invention.
Figure 11:
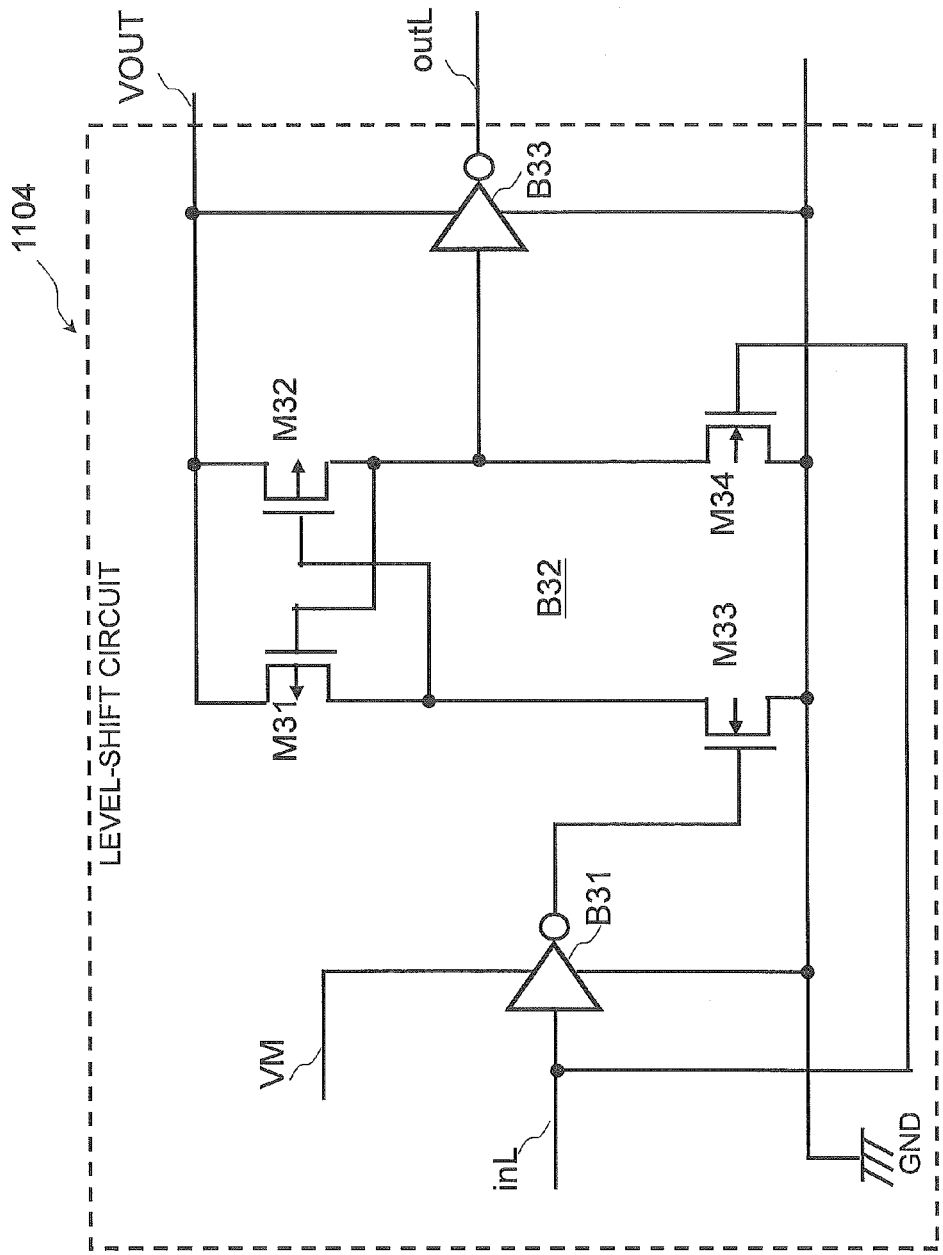
FIG. 11 is a diagram illustrating the configuration of a signal transmission circuit that provides signal transmission between first and second input terminals and first and second output terminals of a level-shift circuit according to the fourth embodiment, which is depicted in FIG. 10.
Figure 13:
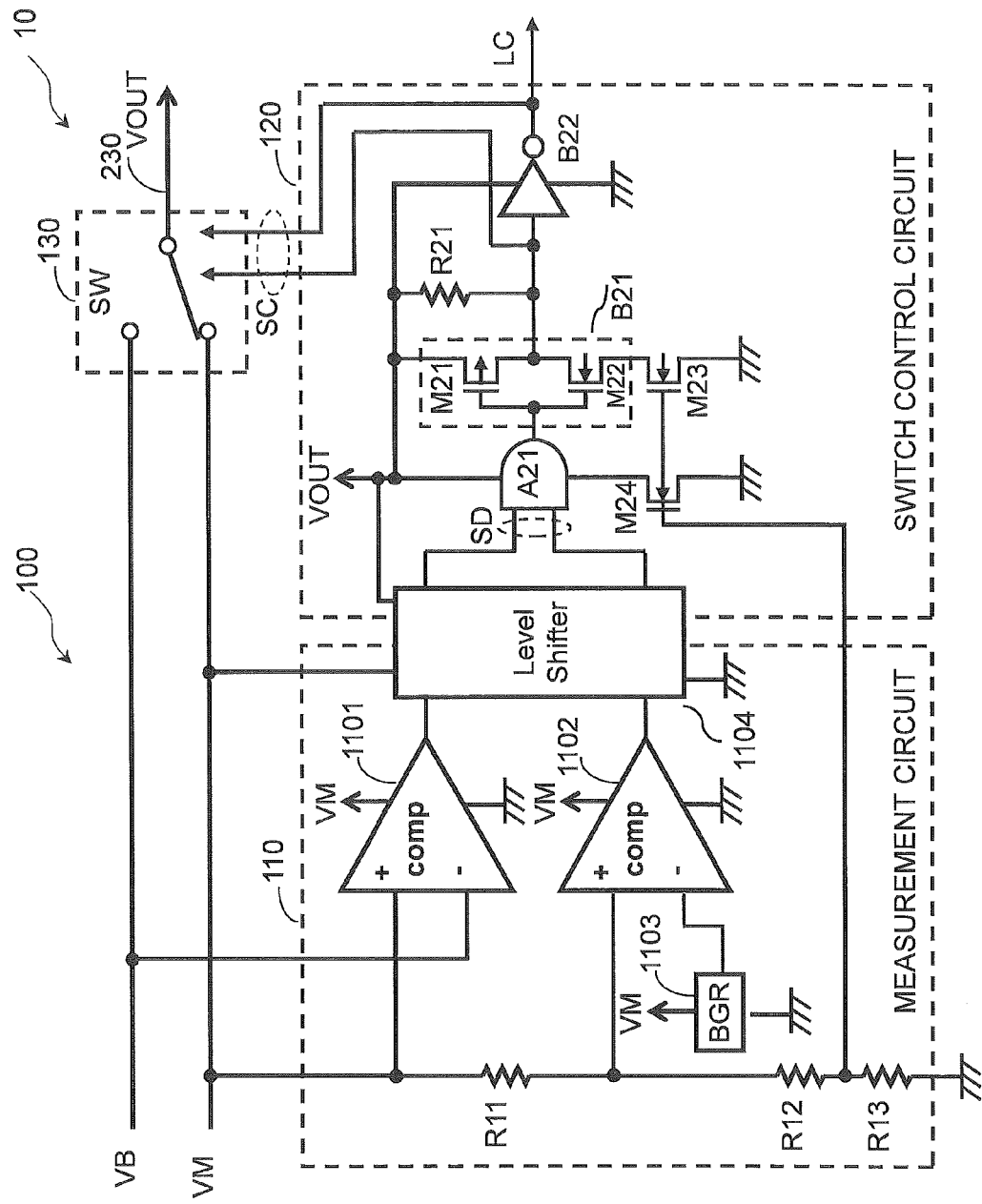
FIG. 13 is a diagram illustrating the configuration of the power supply circuit according to a sixth embodiment of the present invention.

The high-level level-shift output signals generated respectively at the first and second output terminals of the level-shift circuit have the voltage level of the output power supply voltage (VOUT) generated from the output terminal (230) of the power supply circuit (100) (see FIGS. 10, 11, and 13).

In another specific embodiment, the measurement circuit (110) further includes voltage divider circuits (R11, R12, R13) and a reference voltage generation circuit (1103). The voltage divider circuits (R11, R12, R13) generate a divided voltage by dividing the main power supply voltage supplied to the first input terminal. The reference voltage generation circuit (1103) generates a predetermined comparison reference voltage.

The other comparator (1102) compares the divided voltage generated by each of the voltage divider circuits with the predetermined comparison reference voltage generated by the reference voltage generation circuit to detect that the main power supply voltage supplied to the first input terminal is dropped to a voltage lower than the operating lower limit voltage (VMMin) of the earlier-mentioned comparator (1101) (see FIGS. 9, 10, 12, and 13).

In a more specific embodiment, the power supply circuit (100) further includes a level-shift circuit (1104) that is coupled between the measurement circuit (110) and the switch control circuit (120).

The main power supply voltage (VM) supplied to the first input terminal of the power supply circuit (100) and the output power supply voltage (VOUT) generated from the output terminal (230) of the power supply circuit (100) are supplied to the level-shift circuit (1104) as a power supply voltage.

The output signal of the earlier-mentioned comparator (1101) of the measurement circuit (110) is supplied to the first input terminal of the level-shift circuit (1104).

The first output terminal of the level-shift circuit (1104) is coupled to the input terminal of the first inverter (B21) in the switch control circuit (120).

The level-shift circuit is capable of converting a high-level input signal supplied to the first input terminal of the level-shift circuit to a high-level level-shift output signal, which is generated at the first output terminal of the level-shift circuit.

The high-level input signal supplied to the first input terminal of the level-shift circuit has the voltage level of the main power supply voltage supplied to the first input terminal.

Figure 14:
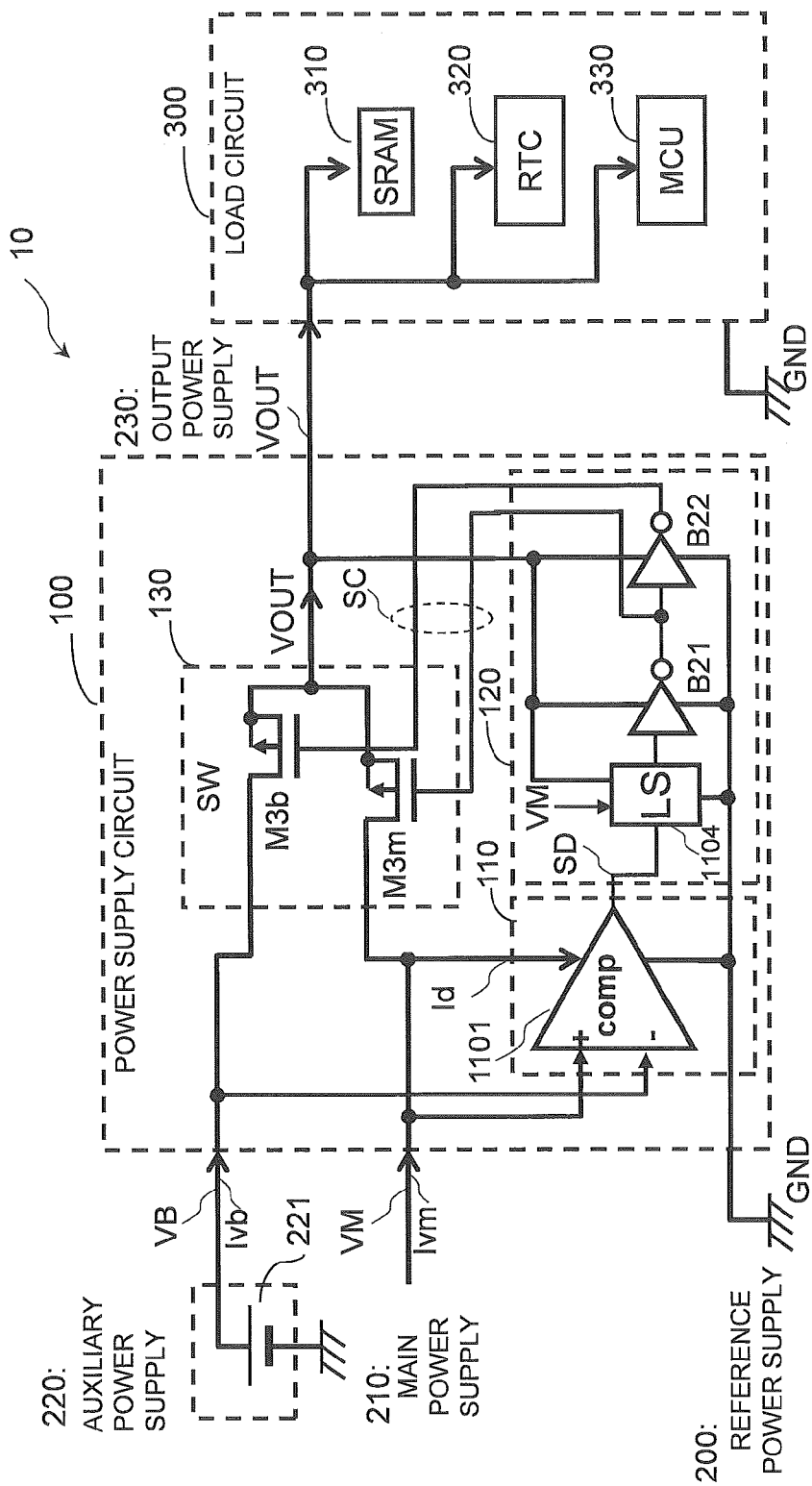
FIG. 14 is a diagram illustrating the configuration of the power supply circuit according to a seventh embodiment of the present invention.

The high-level level-shift output signal generated at the first output terminal of the level-shift circuit has the voltage level of the output power supply voltage (VOUT) generated from the output terminal (230) of the power supply circuit (100) (see FIG. 14).

In another more specific embodiment, the load (300) is a semiconductor integrated circuit having internal core circuits (310, 320, 330).

The semiconductor integrated circuit having the power supply circuit (100) and the semiconductor integrated circuit having the internal core circuits of the load (300) are formed in the same semiconductor chip.

In the most specific embodiment, the load (300) is a semiconductor integrated circuit having internal core circuits (310, 320, 330).

The semiconductor integrated circuit having the power supply circuit (100) and the semiconductor integrated circuit having the internal core circuits of the load (300) are respectively formed in separate semiconductor chips.

[2] According to another representative embodiment, there is provided a method of operating a semiconductor integrated circuit including a power supply circuit (100) having a first input terminal, a second input terminal, and an output terminal (230).

A main power supply voltage (VM) from a main power supply (210) can be supplied to the first input terminal. An auxiliary power supply voltage (VB) from an auxiliary power supply (220) can be supplied to the second input terminal. An output power supply voltage (VOUT) generated from the output terminal (230) can be supplied to a load (300).

The power supply circuit (100) includes a measurement circuit (110), a switch control circuit (120), and a switch circuit (130).

The switch circuit (130) includes a first switch element (M3m) and a second switch element (M3b). The first switch element (M3m) is coupled between the first input terminal and the output terminal (230). The second switch element (M3b) is coupled between the second input terminal and the output terminal (230).

The measurement circuit (110) operates on the main power supply voltage (VM) supplied to the first input terminal and compares the main power supply voltage (VM) supplied to the first input terminal with the auxiliary power supply voltage (VB) supplied to the second input terminal.

In response to a determination signal (SD) of the measurement circuit (110), the switch control circuit (120) controls the first switch element (M3m) and second switch element (M3b) in the switch circuit (130).

When the main power supply voltage (VM) supplied to the first input terminal is higher than the auxiliary power supply voltage (VB) supplied to the second input terminal, control is made in response to the determination signal (SD) of the measurement circuit (110) so that the first switch element (M3m) and second switch element (M3b) in the switch circuit (130) are placed in an ON state and an OFF state, respectively.

When the main power supply voltage (VM) supplied to the first input terminal is lower than the auxiliary power supply voltage (VB) supplied to the second input terminal, control is made in response to the determination signal (SD) of the measurement circuit (110) so that the first switch element (M3m) and second switch element (M3b) in the switch circuit (130) are placed in the OFF state and the ON state, respectively (see FIG. 1).

The above-described embodiment makes it possible to not only reduce voltage drop when the power supply circuit makes a selection between the power supply voltage of the main power supply and the backup power supply voltage from the auxiliary power supply, but also reduce the power consumption of the auxiliary power supply.

2. Further Detailed Description of the Embodiments

Embodiments of the present invention will now be described in further detail. Throughout the drawings for illustrating the best embodiments for implementing the present invention, parts having the same functions are designated by the same reference numerals and will not be redundantly described.

First Embodiment

Configuration of an Electronic Device

FIG. 1 is a diagram illustrating a configuration of an electronic device 100 having a power supply circuit 100 according to a first embodiment of the present invention.

As depicted in FIG. 1, the electronic device 10 according to the first embodiment includes a main power supply (VM) 210, an auxiliary power supply (VB) 220, a reference power supply (GND) 200, a power supply circuit 100, and a load circuit 300.

The main power supply (VM) 210 supplies a main power supply voltage VM to a first input terminal of the power supply circuit 100. The main power supply voltage VM is generated, for instance, through a commercial power source, an AC adapter, a rectifier/smoothing circuit, and a DC-to-DC converter.

The auxiliary power supply (VB) 220 supplies an auxiliary power supply voltage VB to a second input terminal of the power supply circuit 100 in order to supply the auxiliary power supply voltage VB for backup even in a state where the main power supply voltage VM from the main power supply (VM) 210 is not supplied. Hence, the auxiliary power supply (VB) 220 includes a battery 221. The battery 221 may be a primary battery, which is not rechargeable, a secondary battery, which is rechargeable, or any other battery different from the main power supply (VM) 210.

The reference power supply (GND) 200 is, for example, a ground potential GND. It serves as an operating common reference potential for the power supply circuit 100 and load circuit 300 of the electronic device 10.

The power supply circuit 100 is capable of comparing the main power supply voltage VM of the main power supply (VM) 210 and the auxiliary power supply voltage VB of the auxiliary power supply (VB) 220, selecting the higher of the two power supply voltages, and supplying the selected power supply voltage to the load circuit 300 through an output terminal 230 as an output power supply voltage VOUT.

<<Load Circuit>>

The load circuit 300 is a semiconductor integrated circuit that operates on the output power supply voltage VOUT, which is generated at the output terminal 230 of the power supply circuit 100.

A memory (SRAM or static random access memory) 310, a timer circuit (RTC or real-time clock) 320, and a microcomputer (MCU or microcontroller unit) 330 are integrated into a semiconductor chip for the semiconductor integrated circuit formed as the load circuit 300 depicted in FIG. 1. Although not depicted in FIG. 1, an internal step-down power supply circuit may be integrated into the load circuit 300 so that an internal step-down power supply voltage generated from the internal step-down power supply circuit is supplied to miniaturized internal core circuits including, for example, the memory 310, the timer circuit 320, and the microcomputer 330.

<<Configuration of the Power Supply Circuit>>

The power supply circuit 100 is formed as a semiconductor chip of a semiconductor integrated circuit. A measurement circuit 110, a switch (SW) control circuit 120, and a switch (SW) circuit 130 are integrated into this semiconductor chip.

The semiconductor chip of the semiconductor integrated circuit formed as the power supply circuit 100 depicted in FIG. 1 may be the same semiconductor chip as the semiconductor chip of the semiconductor integrated circuit formed as the load circuit 300 or separate from the semiconductor chip of the semiconductor integrated circuit formed as the load circuit 300.

The measurement circuit 110 includes a comparator 1101 that operates on the main power supply voltage VM. The comparator 1101 is coupled between the main power supply (VM) 210 and the reference power supply (GND) 200. The main power supply voltage VM is supplied to a non-inverting input terminal (+) of the comparator 1101. The auxiliary power supply voltage VB is supplied to an inverting input terminal (−) of the comparator 1101. A determination signal SD is generated from the output terminal of the comparator 1101.

Consequently, when the main power supply voltage VM of the main power supply (VM) 210 is higher than the auxiliary power supply voltage VB of the auxiliary power supply (VB) 220, the output terminal of the comparator 1101 in the measurement circuit 110 generates the determination signal SD having a high level "1". When, on the contrary, the main power supply voltage VM of the main power supply (VM) 210 is lower than the auxiliary power supply voltage VB of the auxiliary power supply (VB) 220, the output terminal of the comparator 1101 in the measurement circuit 110 generates the determination signal SD having a low level "0".

In an extreme case where the main power supply voltage VM of the main power supply (VM) 210 is lower than the auxiliary power supply voltage VB of the auxiliary power supply (VB) 220 and equal to the ground potential GND, the comparator 1101 in the measurement circuit 110 stops operating so that the output terminal of the comparator 1101 in the measurement circuit 110 generates the determination signal SD having the low level "0". A high-resistance pull-down resistor may be coupled between the reference power supply (GND) 200 and the output terminal of the comparator 1101 to ensure that the determination signal SD having the low level "0" is generated from the output terminal of the comparator 1101 in the measurement circuit 110, which is stopped by the main power supply voltage VM of the main power supply (VM) 210 that is extremely low and equal to the ground potential GND.

The switch (SW) control circuit 120 includes two cascade-coupled inverters B21, B22, which operate on the output power supply voltage VOUT generated at the output terminal 230 of the power supply circuit 100. The determination signal SD generated from the output terminal of the comparator 1101 in the measurement circuit is supplied to an input terminal of the first inverter B21. An output signal of the first inverter B21 is supplied to an input terminal of the second inverter B22. Input and output signals of the second inverter B22 are supplied to the switch (SW) circuit 130 as a switch control signal SC.

The switch (SW) circuit 130 includes a first P-channel MOS transistor M3m and a second P-channel MOS transistor M3b. The drain-source path of the first P-channel MOS transistor M3m is coupled between the first input terminal and the output terminal 230 of the power supply circuit 100. The drain-source path of the second P-channel MOS transistor M3b is coupled between the second input terminal and the output terminal 230 of the power supply circuit 100. The gate of the first P-channel MOS transistor M3m is driven by the input signal of the second inverter B22. The gate of the second P-channel MOS transistor M3b is driven by the output signal of the second inverter B22.

When the main power supply voltage VM of the main power supply (VM) 210 is higher than the auxiliary power supply voltage VB of the auxiliary power supply (VB) 220, the determination signal SD having the high level "1", which is generated from the output terminal of the comparator 1101 in the measurement circuit 110, places the input signal of the second inverter B22 at the low level "0" and the output signal of the second inverter B22 at the high level "1". Hence, the switch (SW) circuit 130 is controlled so as to place the first P-channel MOS transistor M3m in an ON state and the second P-channel MOS transistor M3b in an OFF state. Consequently, the main power supply voltage VM of the main power supply (VM) 210, which is a high voltage, is selected by the switch (SW) circuit 130 and generated from the output terminal 230 as the output power supply voltage VOUT.

When the auxiliary power supply voltage VB of the auxiliary power supply (VB) 220 is higher than the main power supply voltage VM of the main power supply (VM) 210, the determination signal SD having the low level "0", which is generated from the output terminal of the comparator 1101 in the measurement circuit 110, places the input signal of the second inverter B22 at the high level "1" and the output signal of the second inverter B22 at the low level "0". Hence, the switch (SW) circuit 130 is controlled so as to place the first P-channel MOS transistor M3m in the OFF state and the second P-channel MOS transistor M3b in the ON state. Consequently, the auxiliary power supply voltage VB of the auxiliary power supply (VB) 220, which is a high voltage, is selected by the switch (SW) circuit 130 and generated from the output terminal 230 as the output power supply voltage VOUT.

<<Backflow Prevention Configuration of the Switch Circuit>>

In the switch (SW) circuit 130, the first P-channel MOS transistor M3m and the second P-channel MOS transistor M3b are configured to provide backflow prevention.

As described above, one of the main power supply voltage VM of the main power supply (VM) 210 and the auxiliary power supply voltage VB of the auxiliary power supply (VB) 220 is high and the other is low so that the higher of the two power supply voltages is selected by the power supply circuit 100 and generated from the output terminal 230 as the output power supply voltage VOUT. In this situation, a backward current may flow from the high output power supply voltage VOUT at the output terminal 230 of the power supply circuit 100 to a low voltage at the first or second input terminal of the power supply circuit 100.

When, for instance, a primary battery, which is not rechargeable, is employed as the auxiliary battery (VB) 220 and a backward current flows to the non-rechargeable auxiliary power supply (VB) 220 formed of the primary battery, a charging process takes place to burn, damage, or significantly shorten the life of the auxiliary power supply (VB) 220 formed of the primary battery.

To address the above-mentioned problem, the first P-channel MOS transistor M3m and second P-channel MOS transistor M3b in the switch (SW) circuit 130 of the power supply circuit 100 according to the first embodiment depicted in FIG. 1 are configured to provide backflow prevention.

As depicted in FIG. 1, the drain of the first P-channel MOS transistor M3m is coupled to the main power supply voltage VM of the main power supply (VM) 210, which is developed at the first input terminal of the power supply circuit 100. The source and substrate of the first P-channel MOS transistor M3m are coupled to the high output power supply voltage VOUT developed at the output terminal 230 of the power supply circuit 100. The drain of the second P-channel MOS transistor M3b is coupled to the auxiliary power supply voltage VB of the auxiliary power supply (VB) 220, which is developed at the second input terminal of the power supply circuit 100. The source and substrate of the second P-channel MOS transistor M3b are coupled to the high output power supply voltage VOUT developed at the output terminal 230 of the power supply circuit 100.

FIG. 2 is a diagram illustrating how backflow prevention is provided by the first and second P-channel MOS transistors M3m, M3b of the switch (SW) circuit 130 in the power supply circuit 100 according to the first embodiment, which is depicted in FIG. 1.

As depicted in FIG. 2, the switch (SW) circuit 130 is configured so that the P-type drain D of the first P-channel MOS transistor M3m is coupled to the main power supply voltage VM of the main power supply (VM) 210, which is developed at the first input terminal of the power supply circuit 100, and that the P-type source S and N-type substrate Sub of the first P-channel MOS transistor M3m are coupled to the high output power supply voltage VOUT developed at the output terminal 230 of the power supply circuit 100. Let us assume a case where the first P-channel MOS transistor M3m of the switch (SW) circuit 130 is OFF, that is, the load 300 is driven by the auxiliary power supply voltage VB that is higher than the main power supply voltage VM. In this case, a parasitic diode M3m D between the P-type drain D and N-type substrate Sub of the first P-channel MOS transistor M3m prevents a backward current flow from the high output power supply voltage VOUT at the output terminal 230 of the power supply circuit 100 to the low main power supply voltage VM of the main power supply (VM) 210 at the first input terminal of the power supply circuit 100. If the backward current flow occurs, the output power supply voltage VOUT at the output terminal 230 of the power supply circuit 100 significantly lowers its voltage level. This may cause the memory 310, timer circuit 320, and microcomputer 330 in the load circuit 300 to malfunction. Further, as the auxiliary power supply voltage VB supplies a current to the switch (SW) control circuit 120 and to the load circuit 200, the period of time during which the battery 221 in the auxiliary power supply (VB) 220 can be used for driving purposes becomes shorter.

Moreover, as depicted in FIG. 2, the switch (SW) circuit 130 is configured so that the P-type drain D of the second P-channel MOS transistor M3*b* is coupled to the auxiliary power supply voltage VB of the auxiliary power supply (VB) 220, which is developed at the second input terminal of the power supply circuit 100, and that the P-type source S and N-type substrate Sub of the second P-channel MOS transistor M3*b* are coupled to the high output power supply voltage VOUT developed at the output terminal 230 of the power supply circuit 100. Let us assume a case where the second P-channel MOS transistor M3*b* of the switch (SW) circuit 130 is OFF, that is, the load 300 is driven by the main power supply voltage VM that is higher than the auxiliary power supply voltage VB. In this case, a parasitic diode M3*b*_D between the P-type drain D and N-type substrate Sub of the second P-channel MOS transistor M3*b* prevents a backward current flow from the high output power supply voltage VOUT at the output terminal 230 of the power supply circuit 100 to the low auxiliary power supply voltage VB of the auxiliary power supply (VB) 220 at the second input terminal of the power supply circuit 100. If the backward current flow occurs, the output power supply voltage VOUT at the output terminal 230 of the power supply circuit 100 significantly lowers its voltage level. This may cause the memory 310, timer circuit 320, and microcomputer 330 in the load circuit 300 to malfunction. Further, if a backward current flows to the auxiliary power supply (VB) 220 when its battery 221 is formed of a primary battery, which is not rechargeable, a charging process takes place to burn, damage, or significantly shorten the life of the auxiliary power supply (VB) 220 formed of the primary battery.

As described above, the switch (SW) circuit 130 according to the first embodiment, which is depicted in FIG. 2, prevents the flow of a backward current. This makes it possible to avoid the above-mentioned problems.

FIG. 3 is a diagram illustrating another configuration of the switch (SW) circuit 130 that provides backflow prevention and is included in the power supply circuit 100 according to the first embodiment, which is depicted in FIG. 1.

The following describes the difference between the switch (SW) circuit 130 in the power supply circuit 100 that is depicted in FIG. 3 and the switch (SW) circuit 130 in the power supply circuit 100 that is depicted in FIG. 2.

In the switch (SW) circuit 130 depicted in FIG. 3, the first and second P-channel MOS transistors M3*m*, M3*b* of the switch (SW) circuit 130 depicted in FIG. 2 are respectively replaced by two series-coupled first P-channel MOS transistors M3*m*1, M3*m*2 and two series-coupled second P-channel MOS transistors M3*b*1, M3*b*2.

Consequently, in the switch (SW) circuit 130 depicted in FIG. 3, two series-coupled parasitic diodes M3*m*_D1, M3*m*_D2 are series-coupled in back-to-back configuration between the first input terminal and the output terminal 230 of the power supply circuit 100. Further, in the switch (SW) circuit 130 depicted in FIG. 3, two series-coupled parasitic diodes M3*b*_D1, M3*b*_D2 are series-coupled in back-to-back configuration between the second input terminal and the output terminal 230 of the power supply circuit 100. As a result, the two series-coupled parasitic diodes M3*m*_D1, M3*m*_D2 in the switch (SW) circuit 130 depicted in FIG. 3 prevent a backward current flow from the high output power supply voltage VOUT at the output terminal 230 of the power supply circuit 100 to the low main power supply voltage VM of the main power supply (VM) 210 at the first input terminal of the power supply circuit 100. Further, the two series-coupled parasitic diodes M3*b*_D1, M3*b*_D2 prevent a backward current flow from the high output power supply voltage VOUT at the output terminal 230 of the power supply circuit 100 to the low auxiliary power supply voltage VB of the auxiliary power supply (VB) 220 at the second input terminal of the power supply circuit 100.

FIG. 4 is a diagram illustrating still another configuration of the switch (SW) circuit 130 that provides backflow prevention and is included in the power supply circuit 100 according to the first embodiment, which is depicted in FIG. 1.

The switch (SW) circuit 130 in the power supply circuit 100 that is depicted in FIG. 4 differs from the switch (SW) circuit 130 in the power supply circuit 100 that is depicted in FIG. 3 in that the two series-coupled first P-channel MOS transistors M3*m*1, M3*m*2 and two series-coupled second P-channel MOS transistors M3*b*1, M3*b*2 depicted in FIG. 4 are coupled in an order reverse from that indicated in FIG. 3.

The switch (SW) circuit 130 depicted in FIG. 4 is also configured so that the two series-coupled parasitic diodes M3*m*_D1, M3*m*_D2 prevent a backward current flow from the high output power supply voltage VOUT at the output terminal 230 of the power supply circuit 100 to the low main power supply voltage VM of the main power supply (VM) 210 at the first input terminal of the power supply circuit 100, and that the two series-coupled parasitic diodes M3*b*_D1, M3*b*_D2 prevent a backward current flow from the high output power supply voltage VOUT at the output terminal 230 of the power supply circuit 100 to the low auxiliary power supply voltage VB of the auxiliary power supply (VB) 220 at the second input terminal of the power supply circuit 100.

<<Operation Mode>>

The operation mode of the electronic device 10 having the power supply circuit 100 according to the first embodiment, which has been described with reference to FIGS. 1 to 4, is determined in accordance with the magnitude relationship between the voltage level of the main power supply voltage VM of the main power supply (VM) 210, which is supplied to the first input terminal of the power supply circuit 100, and the voltage level of the auxiliary power supply voltage VB of the auxiliary power supply (VB) 220, which is supplied to the second input terminal.

<<Normal Operation Mode>>

When the measurement circuit 110 in the power supply circuit 100 according to the first embodiment depicted in FIG. 1 determines that the voltage level of the main power supply voltage VM is not lower than the voltage level of the auxiliary power supply voltage VB (VM≥VB), control is made to place the electronic device 10 in a normal operation mode. In this instance, the measurement circuit 110 sets the determination signal D at the high level "1", which represents a normal operation mode level. As a result, in response to the determination signal SD at the high level "1", which represents the normal operation mode level, the switch (SW) control circuit 120 sets the switch control signal SC, which is supplied to the switch (SW) circuit 130, at the normal operation mode level. Hence, the switch (SW) circuit 130 is capable of selecting the high main power supply voltage VM of the main power supply (VM) 210 in response to the switch control signal SC set at the normal operation mode level and supplying the selected voltage to the load circuit 300 through the output terminal 230 as the output power supply voltage VOUT.

In the normal operation mode, the main power supply voltage VM of the main power supply (VM) 210, which is supplied to the first input terminal of the power supply circuit 100, is a high voltage as mentioned above. Thus, the measurement circuit 110 operates on the main power supply voltage VM of the main power supply (VM) 210, measures the magnitude relationship between the power supply voltages VM and VB, and finds that VM≥VB. Further, as the switch (SW) circuit 130 selects the high main power supply voltage VM of the main power supply (VM) 210 and generates the selected voltage at the output terminal 230 as the output power supply voltage VOUT, the switch (SW) control circuit 120 operates on the main power supply voltage VM of the main power supply (VM) 210, which is generated at the output terminal 230.

In the normal operation mode, therefore, the main power supply voltage VM of the main power supply (VM) 210 supplies both the operating power for the load circuit 300 and the operating power for the power supply circuit 100. As the second P-channel MOS transistor M3b of the switch (SW) circuit 130 is placed in the OFF state in the normal operation mode, the auxiliary power supply voltage VB of the auxiliary power supply (VB) 220 is electrically isolated from the load circuit 300.

The input impedances of the non-inverting input terminal (+) and inverting input terminal (−) of the comparator 1101 in the measurement circuit 110 are generally high. In the normal operation mode, therefore, the amount of power applied by the main power supply voltage VM of the main power supply (VM) 210 to the non-inverting input terminal (+) of the comparator 1101 and the amount of power applied by the auxiliary power supply voltage VB of the auxiliary power supply (VB) 220 to the inverting input terminal (−) of the comparator 1101 are both small and negligible. Consequently, in the normal operation mode, the power consumption of the battery 221 in the auxiliary power supply (VB) 220 is low and negligible as well.

Further, in the normal operation mode, the magnitude relationship between the power supply voltages VM and VB (VM≥VB) remains substantially unchanged so that the output terminal of the comparator 1101 in the measurement circuit 110 continuously generates the determination signal SD having the high level "1". Meanwhile, the two inverters B21, B22 included in the switch (SW) control circuit 120 of the power supply circuit 100 are formed of a CMOS inverter circuit. As a result, the power consumptions of the two inverters B21, B22, which are formed of a CMOS inverter circuit and included in the switch (SW) control circuit 120, are also low and negligible in response to the determination signal SD maintained at the high level "1".

<<Power Supply Backup Operation Mode>>

On the other hand, when the measurement circuit 110 in the power supply circuit 100 according to the first embodiment depicted in FIG. 1 determines that the voltage level of the main power supply voltage VM is lower than the voltage level of the auxiliary power supply voltage VB (VM<VB), control is made to place the electronic device 10 in a power supply backup operation mode. In this instance, the measurement circuit 110 sets the determination signal D at the low level "0", which represents a power supply backup operation mode level. As a result, in response to the determination signal SD at the low level "0", which represents the power supply backup operation mode level, the switch (SW) control circuit 120 sets the switch control signal SC, which is supplied to the switch (SW) circuit 130, at the power supply backup operation mode level. Hence, the switch (SW) circuit 130 is capable of selecting the high auxiliary power supply voltage VB of the auxiliary power supply (VB) 220 in response to the switch control signal SC set at the power supply backup operation mode level and supplying the selected voltage to the load circuit 300 through the output terminal 230 as the output power supply voltage VOUT.

In other words, in the power supply backup operation mode, the first P-channel MOS transistor M3m in the switch (SW) circuit 130 is set in the OFF state. Thus, the auxiliary power supply voltage VB of the auxiliary power supply (VB) 220 cannot supply an operating current for the comparator 1101 in the measurement circuit 110. Hence, in the power supply backup operation mode, the measurement circuit 110 operates on the main power supply voltage VM of the main power supply (VM) 210 and measures the magnitude relationship between the power supply voltages VM and VB (VM<VB). In this state, therefore, the measurement circuit 110 does not consume any operating current from the auxiliary power supply (VB) 220.

Further, in the power supply backup operation mode, the second P-channel MOS transistor M3b of the switch (SW) circuit 130 is set in the ON state so that the switch (SW) circuit 130 selects the high auxiliary power supply voltage VB of the auxiliary power supply (VB) 220 and generates the selected voltage at the output terminal 230 as the output power supply voltage VOUT. Hence, the switch (SW) control circuit 120 operates on the auxiliary power supply voltage VB of the auxiliary power supply (VB) 220, which is generated at the output terminal 230. In the power supply backup operation mode, therefore, the auxiliary power supply voltage VB of the auxiliary power supply (VB) 220 supplies both the operating power for the load circuit 300 and the operating power for the switch (SW) control circuit 120 in the power supply circuit 100.

The input impedances of the non-inverting input terminal (+) and inverting input terminal (−) of the comparator 1101 in the measurement circuit 110 are generally high. In the power supply backup operation mode, therefore, the amount of power applied by the main power supply voltage VM of the main power supply (VM) 210 to the non-inverting input terminal (+) of the comparator 1101 and the amount of power applied by the auxiliary power supply voltage VB of the auxiliary power supply (VB) 220 to the inverting input terminal (−) of the comparator 1101 are both small and negligible. Consequently, in the power supply backup operation mode, the amount of power supplied from the battery 221 in the auxiliary power supply (VB) 220 to the inverting input terminal (−) of the comparator 1101 in the measurement circuit 110 is also small and negligible.

Further, in the power supply backup operation mode, the magnitude relationship between the power supply voltages VM and VB (VM<VB) remains substantially unchanged so that the output terminal of the comparator 1101 in the measurement circuit 110 continuously generates the determination signal SD having the low level "0". As mentioned earlier, the two inverters B21, B22 included in the switch (SW) control circuit 120 of the power supply circuit 100 are formed of a CMOS inverter circuit. As a result, the power consumptions of the two inverters B21, B22, which are formed of a CMOS inverter circuit and included in the switch (SW) control circuit 120, are also low and negligible in response to the determination signal SD maintained at the low level "0".

Furthermore, when the main power supply voltage VM of the main power supply (VM) 210 drops to the ground potential GND, the supply of the operating current to the comparator 1101 in the measurement circuit 110 is shut off. Thus, the power consumption of the comparator 1101 in the measurement circuit 110 can be reduced. In this instance, too, the output terminal of the comparator 1101 in the measurement circuit 110 continuously generates the determination signal SD having the low level "0". Hence, the power consumptions of the two inverters B21, B22, which are formed of a CMOS inverter circuit and included in the switch (SW) control circuit 120, are also low and negligible.

Moreover, when the main power supply voltage VM of the main power supply (VM) 210 is restored to the normal magnitude relationship between the power supply voltages VM and VB (VM≥VB) in the power supply backup operation mode, the determination signal SD generated from the output terminal of the comparator 1101 in the measurement circuit 110 switches from the low level "0" to the high level "1". As a result, in the switch (SW) circuit 130, the second P-channel MOS transistor M3b switches from the ON state to the OFF state, and the first P-channel MOS transistor M3m switches from the OFF state to the ON state. Consequently, the operation mode of the electronic device 10 can automatically switch from the power supply backup operation mode to the normal operation mode.

<<Power Consumption for the Comparator in the Measurement Circuit>>

In the electronic device 10 having the power supply circuit 100 according to the first embodiment described with reference to FIGS. 1 to 4, the power supplied to the comparator 1101 in the measurement circuit 110 of the power supply circuit 100 is based on the main power supply voltage VM of the main power supply (VM) 210, which is supplied to the first input terminal of the power supply circuit 100, no matter whether the operation mode is the normal operation mode or the power supply backup operation mode.

Consequently, in the electronic device 10 having the power supply circuit 100 according to the first embodiment described with reference to FIGS. 1 to 4, it is possible to decrease the amount of power that is applied by the auxiliary power supply voltage VB of the auxiliary power supply (VB) 220 to operate the comparator 1101 in the measurement circuit 110.

Further, in the electronic device 10 having the power supply circuit 100 according to the first embodiment described with reference to FIGS. 1 to 4, the input impedances of the non-inverting input terminal (+) and inverting input terminal (−) of the comparator 1101 in the measurement circuit 110 are generally high. As a result, in the power supply backup operation mode, the amount of power applied by the main power supply voltage VM of the main power supply (VM) 210 to the non-inverting input terminal (+) of the comparator 1101 and the amount of power applied by the auxiliary power supply voltage VB of the auxiliary power supply (VB) 220 to the inverting input terminal (−) of the comparator 1101 are both small and negligible.

<<Power Consumption of the Switch Control Circuit>>

According to the electronic device 10 having the power supply circuit 100 according to the first embodiment described with reference to FIGS. 1 to 4, the output terminal of the comparator 1101 in the measurement circuit 110 continuously generates the determination signal SD having the low level "0" in the power supply backup operation mode. As a result, the power consumptions of the two inverters B21, B22, which are formed of a CMOS inverter circuit and included in the switch (SW) control circuit 120, are also low and negligible.

<<Alternative Configuration of the Electronic Device>>

FIG. 5 is a diagram illustrating an alternative configuration of the electronic device 10 having the power supply circuit 100 according to the first embodiment.

The following describes the difference between the alternative configuration of the electronic device 10 having the power supply circuit 100 according to the first embodiment, which is depicted in FIG. 5, and the configuration of the electronic device 10 having the power supply circuit 100 according to the first embodiment, which is depicted in FIG. 1.

In the electronic device 10 having the power supply circuit 100 according to the first embodiment that is depicted in FIG. 5, the output signal of the second-stage inverter B22, which is included in the switch control signal SC supplied from the switch (SW) control circuit 120 to the switch (SW) circuit 130, is supplied to the load circuit 300 as a load control signal LC.

In the power supply backup operation mode, therefore, the electronic device 10 having the power supply circuit 100 according to the first embodiment depicted in FIG. 5 is adapted so that the determination signal SD set at the low level "0", which represents the power supply backup operation mode, places the second P-channel MOS transistor M3b of the switch (SW) circuit 130 in the ON state and the first P-channel MOS transistor M3m in the OFF state. Further, in the power supply backup operation mode, the memory 310, which is formed of an SRAM and included in the load circuit 300, is made inaccessible for reading and writing in response to the load control signal LC having the low level "0". The memory 310 is merely allowed to perform its data retention operation. Furthermore, in the load circuit 300, in response to the load control signal LC having the low level "0", the microcomputer (MCU) 330 switches into a standby mode, which is low in power consumption, and the timer circuit (RTC) 320 continuously performs a predetermined timer operation. Thus, the load circuit 300 switches into the standby mode.

The alternative configuration of the electronic device 10 having the power supply circuit 100 according to the first embodiment, which is depicted in FIG. 5, makes it possible to reduce not only the possibility of an erroneous operation during an access to the memory 310 in the load circuit 300, which is due to a decrease in the main power supply voltage VM of the main power supply (VM) 210, but also the possibility of an erroneous operation during data processing by the microcomputer (MCU) 330 in the load circuit 300. The amount of power applied by the auxiliary power supply voltage VB of the auxiliary power supply (VB) 220 can be continuously minimized while maintaining minimum information required for restoring the main power supply voltage VM of the main power supply (VM) 210 to normal by allowing the memory 310 to continuously perform a data retention operation and the timer circuit (RTC) 320 to continuously operate. This makes it possible to increase the period of time during which power supply backup can be provided by the battery 221 in the auxiliary power supply (VB) 220.

<<Comparator in the Measurement Circuit>>

Figure 6:
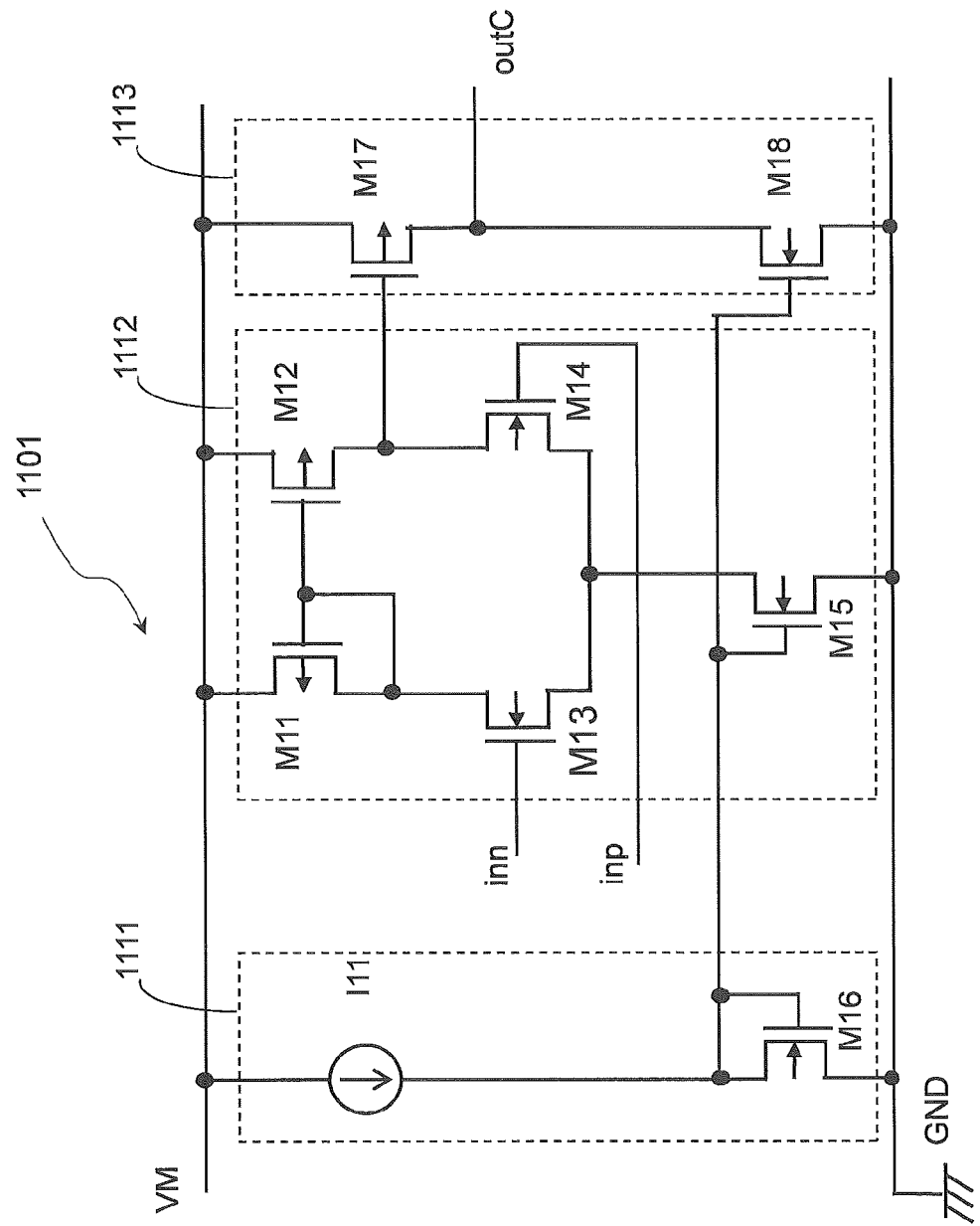
FIG. 6 is a diagram illustrating the configuration of a comparator of a measurement circuit included in the power supply circuit according to the first embodiment, which is depicted in FIGS. 1 and 5.

FIG. 6 is a diagram illustrating the configuration of the comparator 1101 of the measurement circuit 110 included in the power supply circuit 100 according to the first embodiment depicted in FIGS. 1 and 5.

As depicted in FIG. 6, the comparator 1101 includes a bias generation circuit 1111, a differential amplifier 1112, and an output circuit 1113.

The bias generation circuit 1111 includes a constant current source I11 and an N-channel MOS transistor M16. The source of the N-channel MOS transistor M16 is coupled to a reference power supply GND. The gate and drain of the N-channel MOS transistor M16 are coupled. The constant current source I11 is coupled at one end to the main power supply voltage VM of the main power supply (VM) 210 and at the other end to the drain of the N-channel MOS transistor M16. A bias voltage generated at the drain of the N-channel MOS transistor M16 has a voltage value dependent on the current value of the constant current source I11.

The differential amplifier 1112 includes P-channel MOS transistors M11, M12, N-channel MOS transistors M13, M14, and an N-channel MOS transistor M15. The P-channel MOS transistors M11, M12 function as load elements. The N-channel MOS transistors M13, M14 function as differential pair elements. The N-channel MOS transistor M15 functions as a constant current source.

The source of the N-channel MOS transistor M15, which functions as a constant current source, is coupled to the reference power supply GND, and the bias voltage generated at the drain of the N-channel MOS transistor M16 in the bias generation circuit 1111 is supplied to the gate of the N-channel MOS transistor M15. Thus, a constant current corresponding to the bias voltage flows to the drain. As a result, the constant current at the drain of the N-channel MOS transistor M15, which functions as a constant current source, is used as an operating current for the N-channel MOS transistors M13, M14, which function as differential pair elements.

The P-channel MOS transistors M11, M12, which function as load elements, are coupled as a current mirror load. More specifically, the sources of the P-channel MOS transistors M11, M12 are coupled to the main power supply voltage VM of the main power supply (VM) 210, the gate and drain of the P-channel MOS transistor M11 are commonly coupled, and the gate of the 2-channel MOS transistor M11 is further coupled to the gate of the P-channel MOS transistor M12.

The sources of the N-channel MOS transistors M13, M14, which function as differential pair elements, are commonly coupled to the drain of the N-channel MOS transistor M15, which functions as a constant current source as mentioned above. The gate of the N-channel MOS transistor M13 functions as an inverting input terminal inn of the comparator 1101. The gate of the N-channel MOS transistor M14 functions as a non-inverting input terminal inp of the comparator 1101.

The drains of the N-channel MOS transistors M13, M14, which function as differential pair elements, are coupled to the drains of the P-channel MOS transistors M11, M12, which function as load elements. More precisely, the drain current of the N-channel MOS transistor M13, which is one differential pair element, determines the drain current of the P-channel MOS transistor M11 on the input side of the current mirror load and the drain current of the P-channel MOS transistor M12 on the output side of the current mirror load. Further, the gate capacitance of a P-channel MOS transistor M17 in the output circuit 1113 is driven by the current difference between the drain pull-down current of the N-channel MOS transistor M14, which is the other differential pair element, and by the drain pull-up current of the P-channel MOS transistor M12 on the output side of the current mirror load. Consequently, the drain of the N-channel MOS transistor M14, which is the other differential pair element, and the drain of the P-channel MOS transistor M12, which is on the output side of the current mirror load, function as an inverting output terminal of the differential amplifier 1112.

The output circuit 1113 includes the P-channel MOS transistor M17 and an N-channel MOS transistor M18. The P-channel MOS transistor M17 is coupled at its source to the main power supply voltage VM of the main power supply (VM) 210, at its gate to the inverting output terminal of the differential amplifier 1112, and at its drain to the output terminal outC of the output circuit 1113. The source of the N-channel MOS transistor M18 is coupled to the reference power supply GND. The bias voltage generated at the drain of the N-channel MOS transistor M16 in the bias generation circuit 1111 is supplied to the gate of the N-channel MOS transistor M18. Thus, a constant current flows to the drain. As a result, the output capacitance at the output terminal outC of the output circuit 1113 is driven by the current difference between the drain pull-up current of the P-channel MOS transistor M17 and the drain pull-down current of the N-channel MOS transistor M18.

Let us assume a case where, in the comparator 1101, an input voltage at the inverting input terminal inn of the N-channel MOS transistor M13 is lower than an input voltage at the non-inverting input terminal inp of the N-channel MOS transistor M14. In this case, the drain current of the N-channel MOS transistor M13, the drain current of the P-channel MOS transistor M11 on the input side of the current mirror load, and the drain current of the P-channel MOS transistor M12 on the output side of the current mirror load are small currents, whereas the drain current of the N-channel MOS transistor M14 is a large current. As a result, when the gate capacitance of the P-channel MOS transistor M17 in the output circuit 1113 is driven, the drain pull-down current of the N-channel MOS transistor M14 is larger than the drain pull-up current of the P-channel MOS transistor M12 on the output side of the current mirror load. In the output circuit 1113, therefore, the drain pull-up current of the P-channel MOS transistor M17 is larger than the drain pull-down current of the N-channel MOS transistor M18. Consequently, the output terminal outC of the output circuit 1113 generates a high-level output voltage.

Let us assume a case where, in the comparator 1101, an input voltage at the inverting input terminal inn of the N-channel MOS transistor M13 is higher than an input voltage at the non-inverting input terminal inp of the N-channel MOS transistor M14. In this case, the drain current of the N-channel MOS transistor M13, the drain current of the P-channel MOS transistor M11 on the input side of the current mirror load, and the drain current of the P-channel MOS transistor M12 on the output side of the current mirror load are large currents, whereas the drain current of the N-channel MOS transistor M14 is a small current. As a result, when the gate capacitance of the P-channel MOS transistor M17 in the output circuit 1113 is driven, the drain pull-down current of the N-channel MOS transistor M14 is smaller than the drain pull-up current of the P-channel MOS transistor M12 on the output side of the current mirror load. In the output circuit 1113, therefore, the drain pull-up current of the P-channel MOS transistor M17 is smaller than the drain pull-down current of the N-channel MOS transistor M18. Consequently, the output terminal outC of the output circuit 1113 generates a low-level output voltage.

In the comparator 1101 of the measurement circuit 110 according to the first embodiment, which is depicted in FIG. 6, the P-channel MOS transistors M11, M12, which are the load elements for the N-channel MOS transistors M13, M14 acting as the differential pair elements in the differential amplifier 1112, operate as a current mirror load that operates as an active load. Therefore, the differential amplifier in the comparator 1101 can be set for a sufficiently high amplification gain.

<<Waveform Diagram Illustrating an Operation of the Electronic Device>>

Figure 7:
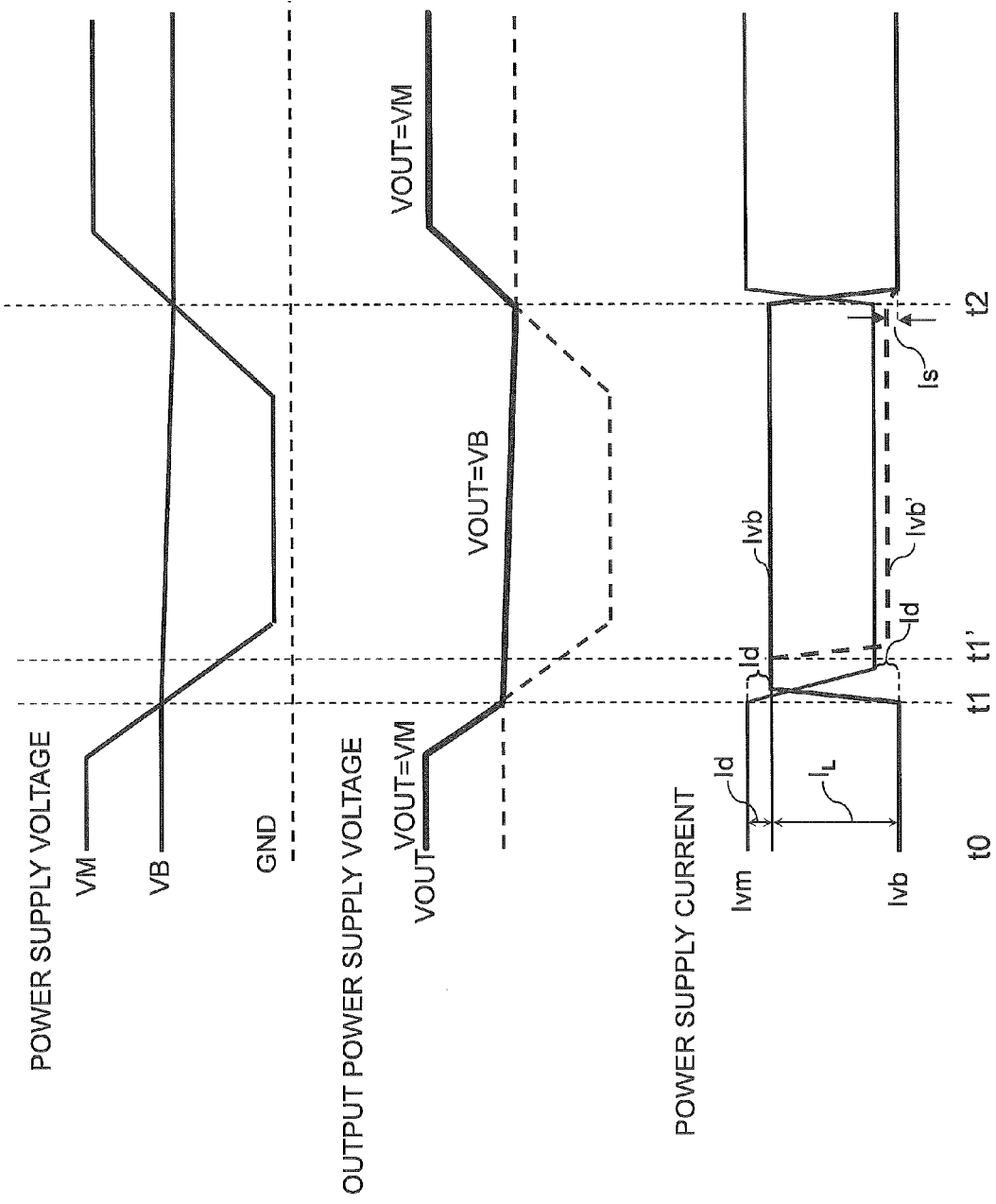
FIG. 7 is a waveform diagram illustrating an operation of the electronic device having the power supply circuit according to the first embodiment, which is described with reference to FIGS. 1 to 6.

FIG. 7 is a waveform diagram illustrating an operation of the electronic device 10 having the power supply circuit 100 according to the first embodiment, which is described with reference to FIGS. 1 to 6.

The uppermost portion of FIG. 7 depicts a voltage waveform of the main power supply voltage VM of the main power supply (VM) 210, which is supplied to the first input terminal of the power supply circuit 100, and a voltage waveform of the auxiliary power supply voltage VB of the auxiliary power supply (VB) 220, which is supplied to the second input terminal of the power supply circuit 100.

The intermediate portion of FIG. 7 depicts a voltage waveform of the output power supply voltage VOUT generated at the output terminal 230 of the power supply circuit 100.

The lowermost portion of FIG. 7 depicts a current waveform of a main power supply current Ivm of the main power supply voltage VM of the main power supply (VM) 210 and a current waveform of an auxiliary power supply current Ivb of the auxiliary power supply voltage VB of the auxiliary power supply (VB) 220.

At time t0 in the normal operation mode, which is depicted in FIG. 7, the main power supply voltage VM of the main power supply (VM) 210 is higher than the auxiliary power supply voltage VB of the auxiliary power supply (VB) 220 as depicted in the uppermost portion of FIG. 7. Therefore, the high main power supply voltage VM of the main power supply (VM) 210 is selected by the switch (SW) circuit 130 and generated from the output terminal 230 as the output power supply voltage VOUT as depicted in the intermediate portion of FIG. 7.

Further, at time t0 in the normal operation mode, which is depicted in FIG. 7, the total current of a load current $I_L$ of the load circuit 300 and a consumption current value Id of the measurement circuit 110 flows as the main power supply current Ivm of the main power supply voltage VM while the current level of the auxiliary power supply current Ivb of the auxiliary power supply voltage VB of the auxiliary power supply (VB) 220 is substantially zero as depicted in the lowermost portion of FIG. 7.

Time t1 in FIG. 7 is a timing at which the operation mode of the electronic device 10 switches from the normal operation mode to the power supply backup operation mode because the main power supply voltage VM of the main power supply (VM) 210 drops below the auxiliary power supply voltage VB of the auxiliary power supply (VB) 220. At and after time t1 in FIG. 7, the high auxiliary power supply voltage VB of the auxiliary power supply (VB) 220 is selected by the switch (SW) circuit 130 and generated from the output terminal 230 as the output power supply voltage VOUT as depicted in the intermediate portion of FIG. 7.

Further, at and after time t1 in FIG. 7, the consumption current value Id of the measurement circuit 110 flows as the main power supply current Ivm of the main power supply voltage VM while the load current $I_L$ of the load circuit 300 flows as the auxiliary power supply current Ivb of the auxiliary power supply voltage VB of the auxiliary power supply (VB) 220.

At time t1' in FIG. 7, in the load circuit 300 in the electronic device 10 having the power supply circuit 100 according to the first embodiment depicted in FIG. 5, in response to the load control signal LC having the low level "0", the memory 310 performs only a data retention operation, the microcomputer (MCU) 330 switches to the standby mode, which is low in power consumption, and the timer circuit (RTC) 320 continues with the predetermined timer operation. In this instance, control is made as indicated by a current waveform Ivb' shown in broken line so that the auxiliary power supply current Ivb provided by the auxiliary power supply voltage VB of the auxiliary power supply (VB) 220 is at the current level of a standby mode current Is of the load circuit 300, which is at a low current level.

Time t2 in FIG. 7 is a timing at which the operation mode of the electronic device 10 reverts from the power supply backup operation mode to the normal operation mode because the main power supply voltage VM of the main power supply (VM) 210 rises above the auxiliary power supply voltage VB of the auxiliary power supply (VB) 220 as depicted in the uppermost portion of FIG. 7. At and after time t2 in FIG. 7, the main power supply voltage VM of the main power supply (VM) 210, which is now restored to a high voltage, is selected by the switch (SW) circuit 130 and generated from the output terminal 230 as the output power supply voltage VOUT as depicted in the intermediate portion of FIG. 7.

At the time of mode switching, an operating current for the switch (SW) control circuit 120 is supplied from the output power supply voltage VOUT at the output terminal 230. However, FIG. 7 does not depict the operating current for the switch (SW) control circuit 120 because it has a small power value and is generated for a short period of time. More specifically, when switching is made at time t1, the operating current for the switch (SW) control circuit 120 is supplied from the main power supply (VM) 210, which supplies to the output power supply voltage VOUT at the output terminal 230, and when switching is made at time t2, the operating current for the switch (SW) control circuit 120 is supplied from the auxiliary power supply (VB) 220, which supplies to the output power supply voltage VOUT at the output terminal 230.

The first embodiment described above makes it possible to increase the period of time during which power supply backup can be provided by the auxiliary power supply voltage VB of the auxiliary power supply (VB) 220 in the power supply backup operation mode. The reason is that, in the power supply backup operation mode prevailing between time t1 and time t2, the auxiliary power supply voltage VB of the auxiliary power supply (VB) 220 supplies only the load current $I_L$ of the load circuit 300 while the main power supply voltage VM of the main power supply (VM) 210 supplies the consumption current value Id of the measurement circuit 110. Therefore, the power consumption of the auxiliary power supply (VB) 220 can be minimized in the power supply backup operation mode. This makes it possible to increase the period of time during which power supply backup can be provided by the battery 221 in the auxiliary power supply (VB) 220.

Further, in the electronic device 10 according to the first embodiment depicted in FIG. 5, control can be made so that the load current $I_L$ supplied from the auxiliary power supply (VB) 220 to the load circuit 300 after the load circuit 300 switches into the standby mode is at the same level as the standby mode current Is of the load circuit 300. This makes it possible to further increase the period of time during which power supply backup can be provided by the battery 221 in the auxiliary power supply (VB) 220.

Second Embodiment

Figure 8:
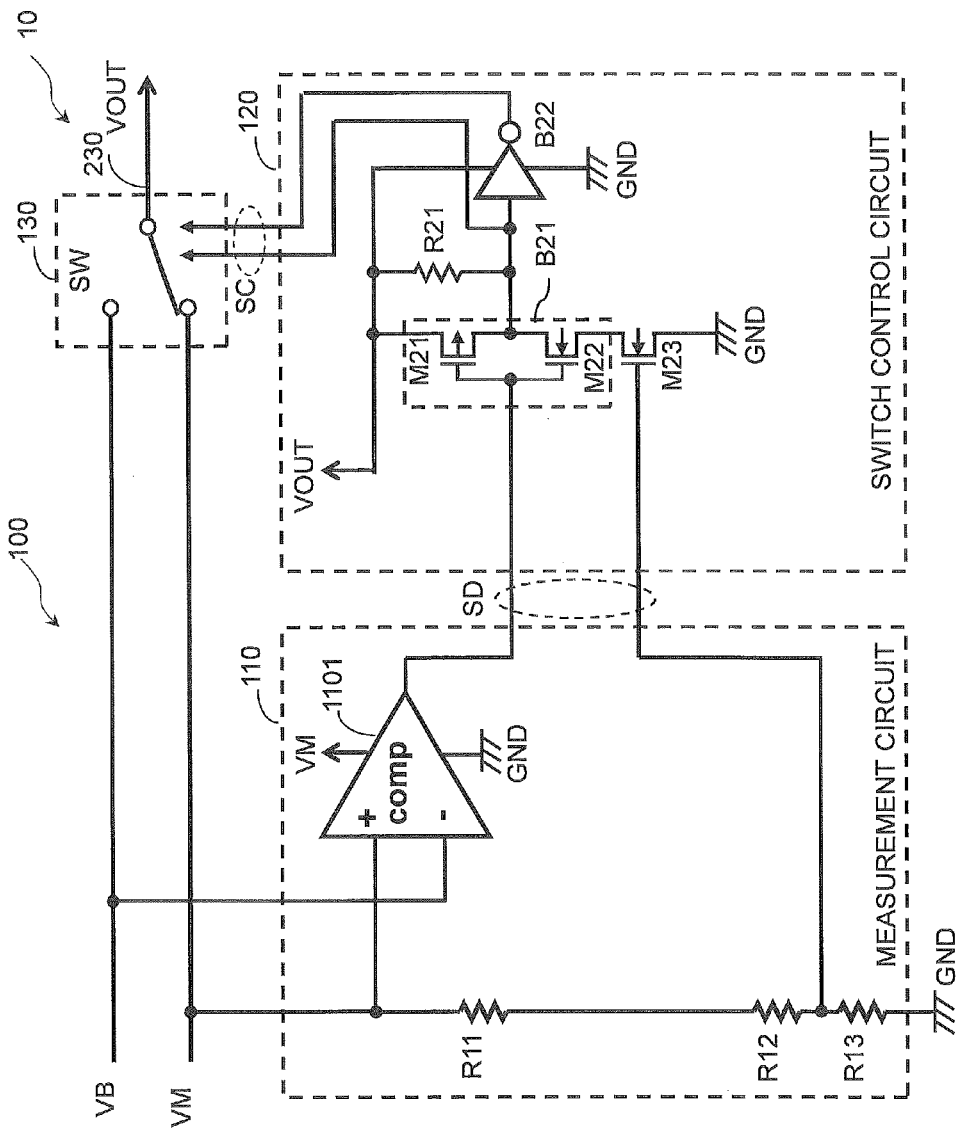
FIG. 8 is a diagram illustrating the configuration of the power supply circuit according to a second embodiment of the present invention.

FIG. 8 is a diagram illustrating the configuration of the power supply circuit 100 according to a second embodiment of the present invention.

The following describes the difference between the power supply circuit 100 according to the second embodiment, which is depicted in FIG. 8, and the power supply circuit 100 according to the first embodiment, which has been described with reference to FIGS. 1 to 7.

Three voltage divider resistors R11, R12, R13, which are series-coupled between the reference power supply GND and the main power supply voltage VM of the main power supply (VM) 210, are added to the measurement circuit 110 in the power supply circuit 100 according to the second embodiment depicted in FIG. 8.

Further, the first-stage inverter B21 of the switch (SW) control circuit 120 in the power supply circuit 100 according to the second embodiment depicted in FIG. 8 includes a P-channel MOS transistor M21 and an N-channel MOS transistor M22, which form a CMOS inverter. An N-channel MOS transistor M23 is added to the first-stage inverter B21. The drain-source path of the N-channel MOS transistor M23 is coupled between the reference power supply GND and the N-channel MOS transistor M22, which is a low-side switch element of the CMOS inverter. The gate of the N-channel MOS transistor M23, which is added to the first-stage inverter B21, is coupled to a common coupling node of the voltage divider resistors R12, R13 of the measurement circuit 110.

Furthermore, a high-resistance pull-up resistor R21 is added to the switch (SW) control circuit 120 in the power supply circuit according to the second embodiment depicted in FIG. 8. The high-resistance pull-up resistor R21 is coupled between the output power supply voltage VOUT at the output terminal of the power supply circuit 100 and the input terminal of the second-stage inverter B22.

Moreover, although not depicted in detail, the switch (SW) circuit 130 in the power supply circuit 100 according to the second embodiment depicted in FIG. 8 has exactly the same configuration as the switch (SW) circuit 130 in the power supply circuit 100 according to the first embodiment described with reference to FIGS. 1 to 7.

In the power supply circuit 100 according to the second embodiment depicted in FIG. 8, therefore, when the main power supply voltage VM of the main power supply (VM) 210 is higher than the auxiliary power supply voltage VB of the auxiliary power supply (VB) 220, the main power supply voltage VM of the main power supply (VM) 210 is selected by the switch (SW) circuit 130 and generated from the output terminal 230 as the output power supply voltage VOUT, as is the case with the power supply circuit 100 according to the first embodiment described with reference to FIGS. 1 to 7. When, on the contrary, the main power supply voltage VM of the main power supply (VM) 210 is lower than the auxiliary power supply voltage VB of the auxiliary power supply (VB) 220, the auxiliary power supply voltage VB of the auxiliary power supply (VB) 220 is selected by the switch (SW) circuit 130 and generated from the output terminal 230 as the output power supply voltage VOUT.

Besides, in the power supply circuit 100 according to the second embodiment depicted in FIG. 8, unlike in the power supply circuit 100 according to the first embodiment described with reference to FIGS. 1 to 7, when the main power supply voltage VM of the main power supply (VM) 210 drops from a level higher than the predetermined reference voltage to a level lower than the predetermined reference voltage, control is made so that the N-channel MOS transistor M23 added to the switch (SW) circuit 130 switches from the ON state to the OFF state. This control scheme corresponds to a control scheme in which the N-channel MOS transistor M23 added to the switch (SW) circuit 130 switches from the ON state to the OFF state when the main power supply voltage VM of the main power supply (VM) 210, which is supplied to the comparator 1101 in the measurement circuit 110, drops from a level higher than the operating lower limit voltage VMMin of the comparator 1101 to a level lower than the operating lower limit voltage VMMin of the comparator 1101.

Consequently, as control is made so that the N-channel MOS transistor M23 switches from the ON state to the OFF state when the main power supply voltage VM drops from a level higher than the operating lower limit voltage VMMin to a level lower than the operating lower limit voltage VMMin, control is made so that the N-channel MOS transistor M22, which is a low-side switch element of the first-stage CMOS inverter B21 in the switch (SW) control circuit 120, is forcibly placed in the OFF state. Therefore, the output terminal of the first-stage CMOS inverter B21 in the switch (SW) control circuit 120 is pulled up by the pull-up resistor R21 to the output power supply voltage VOUT at the output terminal 230. As a result, the switch (SW) circuit 130 switches from a state where the main power supply voltage VM of the main power supply (VM) 210 is selected to a state where the auxiliary power supply voltage VB of the auxiliary power supply (VB) 220 is selected.

The pull-up resistor R21 added to the switch (SW) control circuit 120 according to the second embodiment depicted in FIG. 8 is capable of properly pulling up the output terminal of the first-stage CMOS inverter B21 to the voltage level of the output power supply voltage VOUT at the output terminal 230 when control is made so that the low-side N-channel MOS transistor M22 of the first-stage CMOS inverter B21 is forcibly placed in the OFF state.

For example, the operating lower limit voltage VMMin of the comparator 1101 in the measurement circuit 110 is 1.4 V, and the gate-source threshold voltage of the N-channel MOS transistor M23 added to the first-stage inverter B21 in the switch (SW) control circuit 120 is 0.7 V.

In the second embodiment depicted in FIG. 8, the three voltage divider resistors R11, R12, R13, which are added to the measurement circuit 110 and series-coupled between the reference power supply GND and the main power supply voltage VM of the main power supply (VM) 210, are set so that the relationship between their resistance values is defined by the equation R11+R12=R13.

Consequently, when the main power supply voltage VM of the main power supply (VM) 210 is higher than the operating lower limit voltage VMMin of the comparator 1101 in the measurement circuit 110, which is, for example, 1.4V, the voltage of the common coupling node of the voltage divider resistors R12, R13 of the measurement circuit 110 is higher than the gate-source threshold voltage of the N-channel MOS transistor M23, which is, for example, 0.7 V. In this instance, control is made in accordance with the voltage of the common coupling node of the voltage divider resistors R12, R13 of the measurement circuit 110 so that the N-channel MOS transistor M23 is placed in the ON state.

When, on the other hand, the main power supply voltage VM of the main power supply (VM) 210 is lower than the operating lower limit voltage VMMin of the comparator 1101 in the measurement circuit 110, which is, for example, 1.4 V, the voltage of the common coupling node of the voltage divider resistors R12, R13 of the measurement circuit 110 is lower than the gate-source threshold voltage of the N-channel MOS transistor M23, which is, for example, 0.7 V. In this instance, control is made in accordance with the voltage of the common coupling node of the voltage divider resistors R12, R13 of the measurement circuit 110 so that the N-channel MOS transistor M23 is placed in the OFF state. Thus, control is made so that the N-channel MOS transistor M22, which is a low-side switch element of the first-stage CMOS inverter B21 in the switch (SW) control circuit 120, is forcibly placed in the OFF state. Hence, the output terminal of the first-stage CMOS inverter B21 is pulled up by the pull-up resistor R21 to the output power supply voltage VOUT at the output terminal 230. As a result, the switch (SW) circuit 130 switches from a state where the main power supply voltage VM of the main power supply (VM) 210 is selected to a state where the auxiliary power supply voltage VB of the auxiliary power supply (VB) 220 is selected.

Consequently, the second embodiment depicted in FIG. 8 makes it possible to forcibly define a selection operation of the switch (SW) circuit 130 when the main power supply voltage VM of the main power supply (VM) 210 drops below the operating lower limit voltage VMMin of the comparator 1101, which is, for example, 1.4 V, and the comparator 1101 stops comparing the main power supply voltage VM and the auxiliary power supply voltage VB. More specifically, the selection operation is forcibly defined without regard to the voltage comparison between the main power supply voltage VM and the auxiliary power supply voltage VB, which is made by the comparator 1101, so that the auxiliary power supply voltage VB of the auxiliary power supply (VB) 220 is selected by the switch (SW) circuit 130 and generated from the output terminal 230 as the output power supply voltage VOUT.

Third Embodiment

Figure 9:
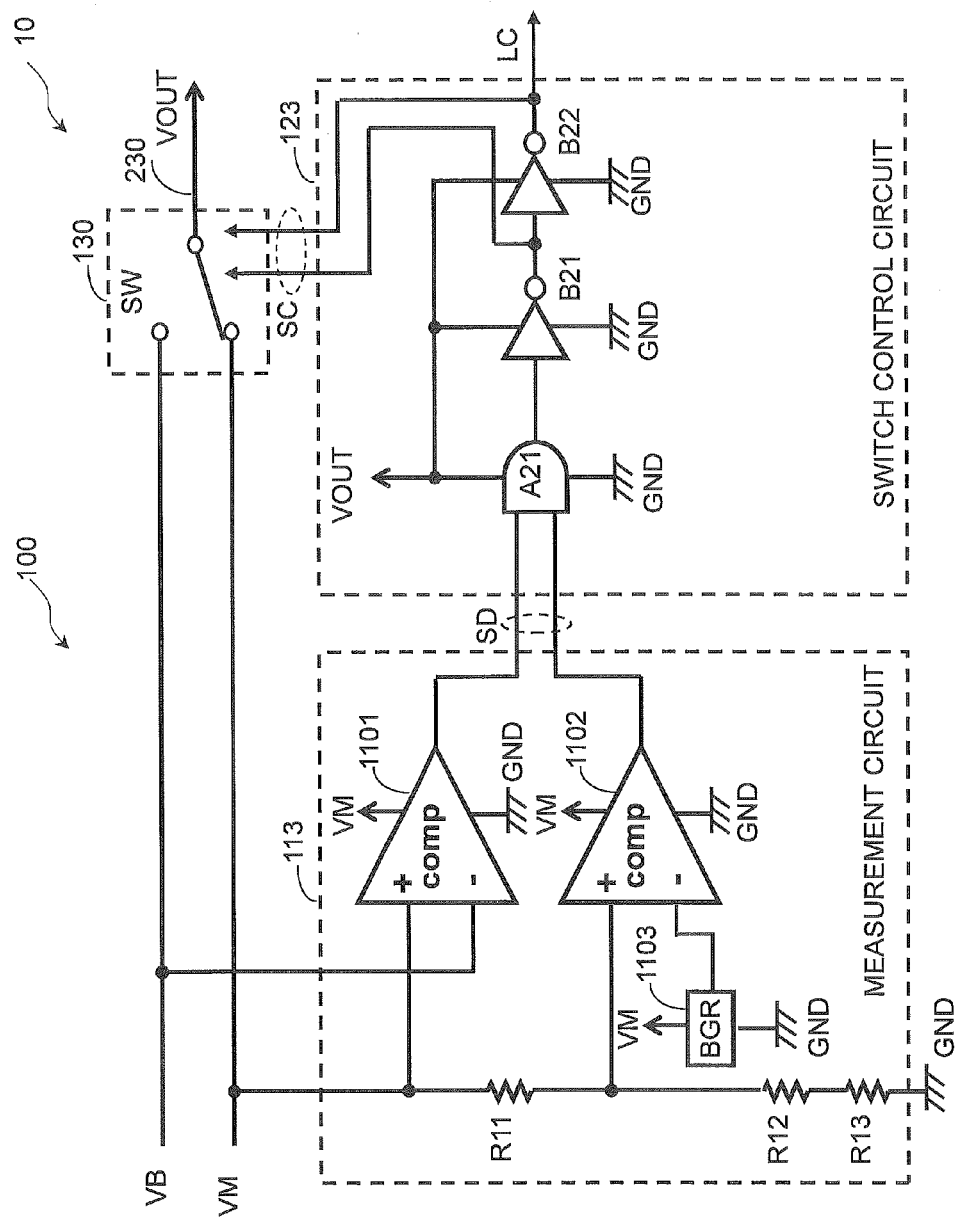
FIG. 9 is a diagram illustrating the configuration of the power supply circuit according to a third embodiment of the present invention.

FIG. 9 is a diagram illustrating the configuration of the power supply circuit 100 according to a third embodiment of the present invention.

The following describes the difference between the power supply circuit 100 according to the third embodiment, which is depicted in FIG. 9, and the power supply circuit 100 according to the first and second embodiments, which are depicted in FIGS. 1 to 7 and FIG. 8, respectively.

The power supply circuit 100 according to the third embodiment depicted in FIG. 9 is configured so that another comparator 1102 and a reference voltage generation circuit 1103 are added to the measurement circuit 110, and that a two-input AND gate A21 is additionally coupled to the input terminal of the first-stage inverter B21 in the switch (SW) control circuit 120.

In the measurement circuit 110 of the power supply circuit 100 according to the third embodiment depicted in FIG. 9, the main power supply voltage VM of the main power supply (VM) 210 is supplied to one end of the voltage divider resistor R11 and to the non-inverting input terminal (+) of the comparator 1101, and the other end of the voltage divider resistor R11 is coupled to the non-inverting input terminal (+) of the comparator 1102. A reference voltage generated from the reference voltage generation circuit 1103 is supplied to an inverting input terminal (−) of the other comparator 1102. The other end of the voltage divider resistor R11 and a non-inverting input terminal (+) of the other comparator 1102 are coupled to the reference power supply (GND) through the two series-coupled voltage divider resistors R12, R13.

The output terminal of the comparator 1101 in the measurement circuit 110 and the output terminal of the other comparator 1102 are respectively coupled to the first and second input terminals of the two-input AND gate A21 in the switch (SW) control circuit 120. The output terminal of the two-input AND gate A21 is coupled to the input terminal of the first-stage inverter B21.

When the comparator 1101 compares the main power supply voltage VM with the auxiliary power supply voltage VB and finds that VM≥VB due, for instance, to a decrease in the amount of power remaining in the battery 221 of the auxiliary power supply (VB) 220, the high main power supply voltage VM of the main power supply (VM) 210 is selected by the switch (SW) circuit 130 and generated at the output terminal 230 as the output power supply voltage VOUT. In this state, however, the main power supply voltage VM of the main power supply (VM) 210 might drop below the operating lower limit voltage VMMin of the comparator 1101 and stop the comparator 1101 from comparing the main power supply voltage VM and the auxiliary power supply voltage VB.

In the power supply circuit 100 according to the third embodiment depicted in FIG. 9, the following forced setup operation is performed in the above state before the main power supply voltage VM of the main power supply (VM) 210 drops below the operating lower limit voltage VMMin of the comparator 1101. When the main power supply voltage VM of the main power supply (VM) 210 drops, the voltage of the common coupling node of the voltage divider resistors R12, R13 in the measurement circuit 110, which is supplied to the non-inverting input terminal (+) of the other comparator 1102, drops below the reference voltage supplied from the reference voltage generation circuit 1103 to the inverting input terminal (−) of the other comparator 1102. Hence, the output voltage at the output terminal of the other comparator 1102 in the measurement circuit 110 is set at the low level. Therefore, the input voltage at the second input terminal of the two-input AND gate A21 in the switch (SW) control circuit 120 is forcibly set at the low level "0". As a result, the output terminal of the first-stage CMOS inverter B21 is pulled up to the output power supply voltage VOUT at the output terminal 230. Consequently, the switch (SW) circuit 130 switches from a state where the main power supply voltage VM of the main power supply (VM) 210 is selected to a state where the auxiliary power supply voltage VB of the auxiliary power supply (VB) 220 is selected.

For example, the operating lower limit voltage VMMin of the comparator 1101 in the measurement circuit 110 and of the other comparator 1102 is 2.0 V, and the reference voltage generated from the reference voltage generation circuit 1103 is 1.2 V, which is a band-gap reference voltage of silicon whose temperature dependence is substantially negligible. Therefore, the resistance values of the three voltage divider resistors R11, R12, R13 are set so that when the main power supply voltage VM of the main power supply (VM) 210 is 2.0V, which is the operating lower limit voltages VMMin, a voltage drop of 0.8 V occurs across the voltage divider resistor R11 to cause a voltage drop of 1.2 V across the two series-coupled voltage divider resistors R12, R13.

Consequently, when the main power supply voltage VM of the main power supply (VM) 210 is higher than the operating lower limit voltage VMMin, which is, for example, 2.0 V, the voltage of the common coupling node of the voltage divider resistors R12, R13 in the measurement circuit 110, which is supplied to the non-inverting input terminal (+) of the other comparator 1102, is higher than the reference voltage supplied from the reference voltage generation circuit 1103 to the inverting input terminal (−) of the other comparator 1102. Hence, as the output voltage at the output terminal of the other comparator 1102 in the measurement circuit 110 is set at the high level, the input voltage at the second input terminal of the two-input AND gate A21 in the switch (SW) control circuit 120 is set the high level "1". As a result, the selection operation of the switch (SW) circuit 130, which is controlled by the switch (SW) control circuit 120, is determined in accordance with the magnitude relationship (VM≥VB) between the main power supply voltage VM and the auxiliary power supply voltage VB, which are compared by the comparator 1101. Therefore, when the main power supply voltage VM of the main power supply (VM) 210 is higher than the auxiliary power supply voltage VB of the auxiliary power supply (VB) 220, the main power supply voltage VM of the main power supply (VM) 210 is selected by the switch (SW) circuit 130 and generated from the output terminal 230 as the output power supply voltage VOUT. When, on the contrary, the main power supply voltage VM of the main power supply (VM) 210 is lower than the auxiliary power supply voltage VB of the auxiliary power supply (VB) 220, the auxiliary power supply voltage VB of the auxiliary power supply (VB) 220 is selected by the switch (SW) circuit 130 and generated from the output terminal 230 as the output power supply voltage VOUT.

However, when the main power supply voltage VM of the main power supply (VM) 210 is lower than the operating lower limit voltage VMMin, which is, for example, 2.0 V, the voltage of the common coupling node of the voltage divider resistors R11, R12 in the measurement circuit 110, which is supplied to the non-inverting input terminal (+) of the other comparator 1102, is lower than the reference voltage supplied from the reference voltage generation circuit 1103 to the inverting input terminal (−) of the other comparator 1102. Hence, as the output voltage at the output terminal of the other comparator 1102 in the measurement circuit 110 is set at the low level, the input voltage at the second input terminal of the two-input AND gate A21 in the switch (SW) control circuit 120 is set the low level "0". As a result, the selection operation of the switch (SW) circuit 130, which is controlled by the switch (SW) control circuit 120, is not dependent on the comparison between the main power supply voltage VM and the auxiliary power supply voltage VB, which is made by the comparator 1101. Consequently, the auxiliary power supply voltage VB of the auxiliary power supply (VB) 220 is selected by the switch (SW) circuit 130 and generated from the output terminal 230 as the output power supply voltage VOUT.

In the power supply circuit 100 according to the third embodiment depicted in FIG. 9, control is made in the power supply backup operation mode so that the load circuit 300 is placed in a low power consumption state in response to the load control signal LC having the low level "0" in the same manner as in the power supply circuit 100 according to the first embodiment depicted in FIG. 5. More specifically, in the load circuit 300, the memory 310 formed of an SRAM is made inaccessible for reading and writing, and merely allowed to perform its data retention operation. Further, in response to the load control signal LC having the low level "0", the microcomputer (MCU) 330 switches into the standby mode, which is low in power consumption, and the timer circuit (RTC) 320 continuously performs the predetermined timer operation.

Fourth Embodiment

FIG. 10 is a diagram illustrating the configuration of the power supply circuit 100 according to a fourth embodiment of the present invention.

The following describes the difference between the power supply circuit 100 according to the fourth embodiment, which is depicted in FIG. 10, and the power supply circuit 100 according to the third embodiment, which is depicted in FIG. 9.

In the power supply circuit 100 according to the fourth embodiment depicted in FIG. 10, a level-shift circuit 1104 is added between the output terminal of the comparator 1101 in the measurement circuit 110, the output terminal of the other comparator 1102 in the measurement circuit 110, and the first and second input terminals of the two-input AND gate A21 in the switch (SW) control circuit 120.

More specifically, the first input terminal of the level-shift circuit 1104 is coupled to the output terminal of the comparator 1101 in the measurement circuit 110, and the second input terminal of the level-shift circuit 1104 is coupled to the output terminal of other comparator 1102 in the measurement circuit 110. Further, the first output terminal of the level-shift circuit 1104 is coupled to the first input terminal of the two-input AND gate A21 in the switch (SW) control circuit 120, and the second output terminal of the level-shift circuit 1104 is coupled to the second input terminal of the two-input AND gate A21 in the switch (SW) control circuit 120.

Let us assume a case where the above-mentioned power supply circuit 100 according to the third embodiment depicted in FIG. 9 operates so that the auxiliary power supply voltage VB of the auxiliary power supply (VB) 220 is selected by the switch (SW) circuit 130 and generated from the output terminal 230 as the output power supply voltage VOUT in response to an initial magnitude relationship between the power supply voltages VM and VB in which VM<VB. In this case, the high auxiliary power supply voltage VB, which is generated as the output power supply voltage VOUT at the output terminal 230 of the power supply circuit 100, is supplied to the two-input AND gate A21 in the switch (SW) control circuit 120 as an operating power supply voltage. Further, as an initial condition for the power supply circuit 100 according to the third embodiment depicted in FIG. 9, the main power supply voltage VM of the main power supply (VM) 210 is higher than an operating lower limit voltage VMMin of 2.0 V. As a result, the voltage of the common coupling node of the voltage divider resistors R11, R12 in the measurement circuit 110, which is supplied to the non-inverting input terminal (+), is higher than the reference voltage supplied from the reference voltage generation circuit 1103 to the inverting input terminal (−) of the other comparator 1102. Consequently, a high-level output signal having the voltage level of the main power supply voltage VM (<VB) is generated from the output terminal of the other comparator 1102 in the measurement circuit 110.

Let us assume that a threshold voltage of a high-side P-channel MOS transistor for the two-input AND gate A21 included in the switch (SW) control circuit 120 in the power supply circuit 100 according to the third embodiment depicted in FIG. 9 is VthP (negative voltage value). Let us focus attention on the main power supply voltage VM of the main power supply (VM) 210, which is supplied to the comparators 1101, 1102 in the measurement circuit 110, the auxiliary power supply voltage VB of the auxiliary power supply (VB) 220, which is supplied the switch (SW) control circuit 120 as the output power supply voltage VOUT at the output terminal of the power supply circuit 100, and the threshold voltage VthP of the P-channel MOS transistor. When the voltage level of the main power supply voltage VM of the main power supply (VM) 210 drops so as to satisfy the relational expression VM<VB−|VthP|, a non-negligible through current flows in the two-input AND gate A21 depending on the circuit configuration of the two-input AND gate A21.

Meanwhile, the above problem of the through current is solved by the level-shift circuit 1104, which is added to the power supply circuit 100 according to the fourth embodiment depicted in FIG. 10 and coupled between the output terminal of the comparator 1101 in the measurement circuit 110, the output terminal of the other comparator 1102 in the measurement circuit 110, and the first and second input terminals of the two-input AND gate A21 in the switch (SW) control circuit 120.

More specifically, the level-shift circuit 1104 added to the power supply circuit 100 according to the fourth embodiment depicted in FIG. 10 is capable of converting the high-level output signal, which has the voltage level of the main power supply voltage VM (<VB) and is generated from the output terminals of the comparators 1101, 1102, to a level-shift output signal having a definitely high level. The definitely high level provided by the level-shift circuit 1104 depicted in FIG. 10 is set at the voltage level of the high auxiliary power supply voltage VB, which is output as the output power supply voltage VOUT at the output terminal 230 of the power supply circuit 100 and supplied to the two-input AND gate A21 in the switch (SW) control circuit 120. As a result, as indicated in FIG. 10, the main power supply voltage VM of the main power supply (VM) 210 and the output power supply voltage VOUT at the output terminal 230 are respectively supplied to the input and output circuits of the level-shift circuit 1104 as an operating power supply voltage.

<<Signal Transmission Circuit in the Level-Shift Circuit>>

FIG. 11 is a diagram illustrating the configuration of a signal transmission circuit that provides signal transmission between the first and second input terminals and the first and second output terminals of the level-shift circuit 1104 according to the fourth embodiment, which is depicted in FIG. 10.

As depicted in FIG. 11, the signal transmission circuit in the level-shift circuit 1104 includes an input-stage CMOS inverter B31, an intermediate-stage CMOS level-up circuit B32, and an output-stage CMOS inverter B33.

The input-stage CMOS inverter B31 is coupled between the reference power supply (GND) and the main power supply voltage VM of the main power supply (VM) 210, and an input signal in L at the first and second input terminals of the level-shift circuit 1104 is supplied to the input terminal of the input-stage CMOS inverter B31.

The intermediate-stage CMOS level-up circuit B32 includes P-channel MOS transistors M31, M32, which are high-side elements, and N-channel MOS transistors M33, M34, which are low-side elements. The sources of the P-channel MOS transistors M31, M32, which are high-side elements, are coupled to the output power supply voltage VOUT at the output terminal 230 of the power supply circuit 100. The sources of the N-channel MOS transistors M33, M34, which are low-side elements, are coupled to the reference power supply (GND). In the intermediate-stage CMOS level-up circuit B32, the drain of the P-channel MOS transistor M31 is coupled to the drain of the N-channel MOS transistor M33, and the drain of the P-channel MOS transistor M32 is coupled to the drain of the N-channel MOS transistor M34. The gates and drains of the P-channel MOS transistors M31, M32, which are high-side elements, are cross-coupled so that the P-channel MOS transistors M31, M32 form a data latch load.

The output signal of the input-stage CMOS inverter B31 is supplied to the gate of the N-channel MOS transistor M33, which is a low-side element. The input signal in L at the input terminal of the input-stage CMOS inverter B31 is supplied to the gate of the N-channel MOS transistor M23, which is a low-side element.

The common coupling node of the drain of the P-channel MOS transistor M32 and the drain of the N-channel MOS transistor M34, which are both included in the intermediate-stage CMOS level-up circuit B32, functions as an output terminal of the intermediate-stage CMOS level-up circuit B32.

The output signal at the output terminal of the intermediate-stage CMOS level-up circuit B32 is supplied to the input terminal of the output-stage CMOS inverter B33. The aforementioned level-shift output signal having a definitely high level is generated from the output terminal outL of the output-stage CMOS inverter B33.

When the input signal in L at the input terminal of the level-shift circuit 1104 depicted in FIG. 11 is at the low level, the output signal of the input-stage CMOS inverter B31 is at the high level. In the intermediate-stage CMOS level-up circuit B32, therefore, the N-channel MOS transistor M33 is ON and the N-channel MOS transistor M34 is OFF. Thus, the P-channel MOS transistor M31 in the intermediate-stage CMOS level-up circuit B32 is OFF and the P-channel MOS transistor M32 in the intermediate-stage CMOS level-up circuit B32 is ON. As a result, the output terminal of a common drain coupling node of the P-channel MOS transistor M32 and N-channel MOS transistor M34 in the intermediate-stage CMOS level-up circuit B32 is at the high level having the voltage level of the output power supply voltage at the output terminal 230. Consequently, the output terminal outL of the output-stage CMOS inverter 333 generates a low-level level-shift output signal having the voltage level of the reference power supply (GND) in response to a high-level output signal of the intermediate-stage CMOS level-up circuit B32.

When the input signal in L at the input terminal of the level-shift circuit 1104 depicted in FIG. 11 is at the high level, the output signal of the input-stage CMOS inverter B31 is at the low level. In the intermediate-stage CMOS level-up circuit B32, therefore, the N-channel MOS transistor M33 is OFF and the N-channel MOS transistor M34 is ON. Thus, the P-channel MOS transistor M31 in the intermediate-stage CMOS level-up circuit B32 is ON and the P-channel MOS transistor M32 in the intermediate-stage CMOS level-up circuit B32 is OFF. As a result, the output terminal of the common drain coupling node of the P-channel MOS transistor M32 and N-channel MOS transistor M34 in the intermediate-stage CMOS level-up circuit B32 is at the low level having the voltage level of the reference power supply (GND). Consequently, the output terminal outL of the output-stage CMOS inverter B33 generates a definitely high-level level-shift output signal having the voltage level of the output power supply voltage VOUT at the output terminal 230.

The above-described power supply circuit 100 according to the fourth embodiment depicted in FIGS. 10 and 11 makes it possible to reduce the through current flowing in the two-input AND gate A21 included in the switch (SW) control circuit 120 and reduce excessive power consumption.

Fifth Embodiment

Figure 12:
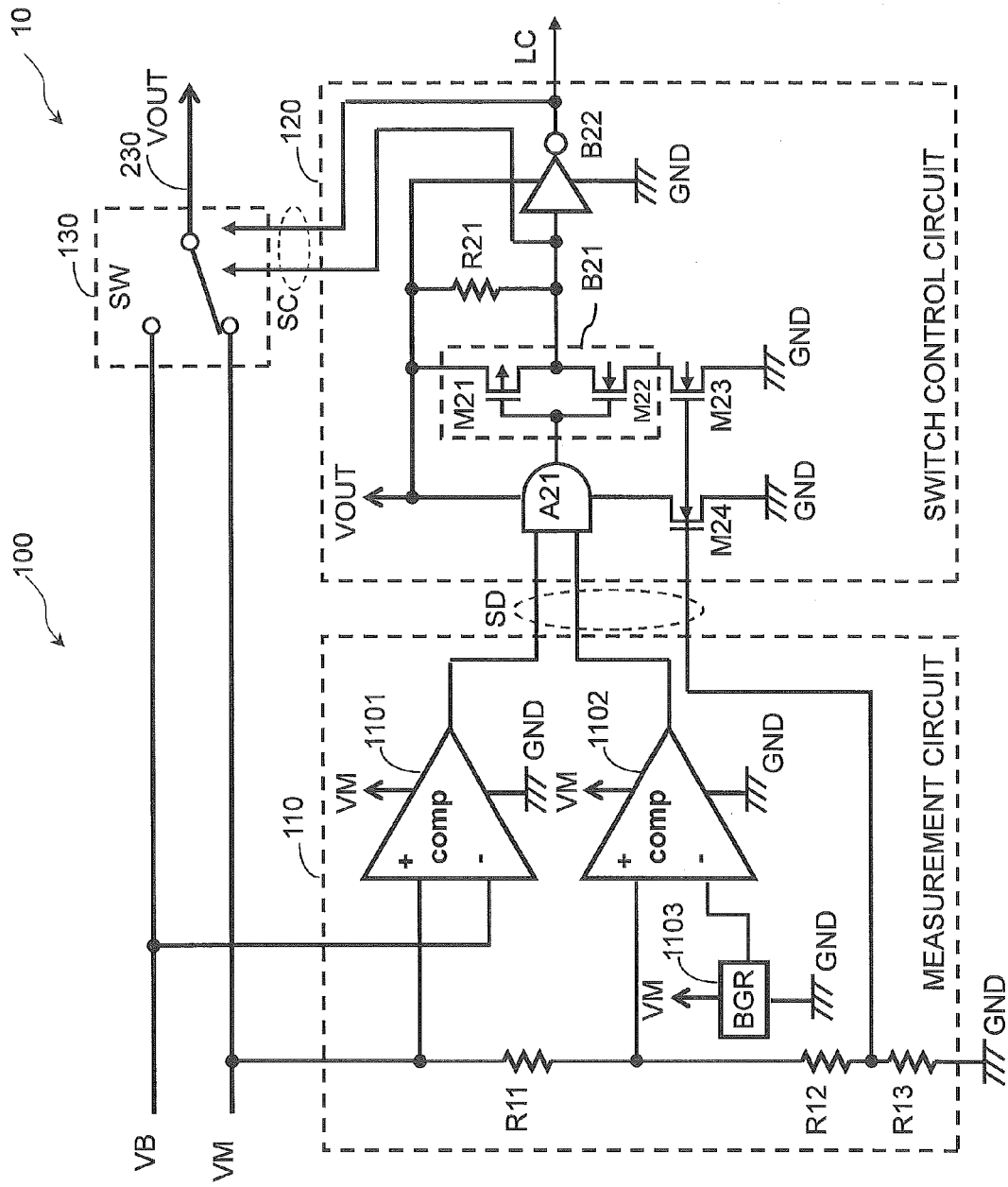
FIG. 12 is a diagram illustrating the configuration of the power supply circuit according to a fifth embodiment of the present invention.

FIG. 12 is a diagram illustrating the configuration of the power supply circuit 100 according to a fifth embodiment of the present invention.

The power supply circuit 100 according to the fifth embodiment depicted in FIG. 12 is obtained by combining the power supply circuit 100 according to the second embodiment depicted in FIG. 8 with the power supply circuit 100 according to the third embodiment depicted in FIG. 9 and adding an N-channel MOS transistor M24 between the two-input AND gate A21 and reference power supply (GND) in the switch (SW) control circuit 120.

Consequently, when the main power supply voltage VM of the main power supply (VM) 210 drops below the operating lower limit voltage VMMin of the comparator 1101 to stop the voltage comparison operation of the comparator 1101, the power supply circuit 100 according to the fifth embodiment depicted in FIG. 12 makes it possible to forcibly define the selection operation of the switch (SW) circuit 130, as is the case with the power supply circuit 100 according to the second embodiment depicted in FIG. 8. More specifically, the selection operation is forcibly defined without regard to the voltage comparison between the main power supply voltage VM and the auxiliary power supply voltage VB, which is made by the comparator 1101, so that the auxiliary power supply voltage VB of the auxiliary power supply (VB) 220 is selected by the switch (SW) circuit 130 and generated from the output terminal 230 as the output power supply voltage VOUT.

Further, the power supply circuit 100 according to the fifth embodiment depicted in FIG. 12 makes it possible to prevent the through current from flowing in the two-input AND gate A21 when the comparator 1101 and the other comparator 1102 in the measurement circuit 110 both generate an output signal having the voltage level of the main power supply voltage VM (<VB) due to a decrease in the voltage level of the main power supply voltage VM of the main power supply (VM) 210 as described above. More specifically, when the main power supply voltage VM of the main power supply (VM) 210 drops below the operating lower limit voltage VMMin of the comparators 1101, 1102, the voltage of the common coupling node of the voltage divider resistors R12, R13 in the measurement circuit 110 performs control to place the N-channel MOS transistors M23, M24 in the OFF state. Thus, as the N-channel MOS transistor M24 coupled between the two-input AND gate A21 and the reference power supply (GND) is in the OFF state, it is possible to prevent the through current from flowing in the two-input AND gate A21. Furthermore, as the N-channel MOS transistor M23 is in the OFF state, control is made so that the N-channel MOS transistor M22, which is a low-side switch element of the first-stage CMOS inverter B21 in the switch (SW) control circuit 120, is forcibly placed in the OFF state. Thus, control is made so that the P-channel MOS transistor M21, which is a high-side switch element of the first-stage CMOS inverter B21 in the switch (SW) control circuit 120, forcibly placed in the ON plate. This causes the output terminal of the first-stage CMOS inverter B21 to be pulled up to the output power supply voltage VOUT at the output terminal 230. As a result, the switch (SW) circuit 130 switches from a state where the main power supply voltage VM of the main power supply (VM) 210 is selected to a state where the auxiliary power supply voltage VB of the auxiliary power supply (VB) 220 is selected.

Sixth Embodiment

FIG. 13 is a diagram illustrating the configuration of the power supply circuit 100 according to a sixth embodiment of the present invention.

The following describes the difference between the power supply circuit 100 according to the sixth embodiment depicted in FIG. 13 and the power supply circuit 100 according to the fifth embodiment depicted in FIG. 12.

The level-shift circuit 1104 according to the fourth embodiment depicted in FIG. 10 is added to the power supply circuit 100 according to the sixth embodiment depicted in FIG. 13.

Consequently, when the main power supply voltage VM of the main power supply (VM) 210 drops, the power supply circuit 100 according to the sixth embodiment depicted in FIG. 13 makes it possible to prevent the through current from flowing in the two-input AND gate A21 because the N-channel MOS transistor M24 coupled to the two-input AND gate A21 is in the OFF state and a level conversion function is made by the level-shift circuit 1104.

Seventh Embodiment

FIG. 14 is a diagram illustrating the configuration of the power supply circuit 100 according to a seventh embodiment of the present invention.

The following describes the difference between the power supply circuit 100 according to the seventh embodiment depicted in FIG. 14 and the power supply circuit 100 according to the first embodiment depicted in FIG. 1.

The level-shift circuit 1104 according to the fourth embodiment depicted in FIG. 10 is added to the power supply circuit 100 according to the seventh embodiment depicted in FIG. 14.

Consequently, when the main power supply voltage VM of the main power supply (VM) 210 drops, the power supply circuit 100 according to the seventh embodiment depicted in FIG. 14 makes it possible to prevent a through current from flowing in the first-stage CMOS inverter B21 because the level conversion function is made by the level-shift circuit 1104 coupled to the first-stage CMOS inverter B21 in the switch (SW) control circuit 120.

While the embodiments of the present invention contemplated by the inventors have been described in detail, the present invention is not limited to the specific embodiments described above. It is to be understood that many variations and modifications of the present invention may be made without departing from the spirit and scope of the present invention.

For example, in the alternative configuration of the electronic device 10 having the power supply circuit 100 according to the first embodiment depicted in FIG. 5, the level-shift circuit 1104 may be added between the output terminal of the comparator 1101 in the measurement circuit 110 and the input terminal of the first inverter B21 in the switch (SW) control circuit 120, as is the case with the seventh embodiment depicted in FIG. 14.

Further, in the configuration of the electronic device 10 having the power supply circuit 100 according to the second embodiment depicted in FIG. 8, the level-shift circuit 1104 may be added between the output terminal of the comparator 1101 in the measurement circuit 110 and the input terminal of the first inverter B21 in the switch (SW) control circuit 120.

Furthermore, the switch elements M3$m$, M3$b$ included in the switch (SW) circuit 130 are not limited to MOS transistors. Insulated-gate bipolar transistors (IGBTs) or controlled rectifier elements such as silicon-controlled rectifiers (SCRs) and thyristors may alternatively be used.

Moreover, the power supply circuit 100, which is an integrated circuit including the measurement circuit 110, the switch (SW) control circuit 120, and the switch (SW) circuit 130, is not limited to a monolithic semiconductor chip having a semiconductor integrated circuit. For example, the power supply circuit 100 may be formed as a hybrid semiconductor integrated circuit enclosed in a resin-sealed package that includes a power semiconductor chip having the switch elements M3$m$, M3$b$ forming the switch (SW) circuit 130 and a semiconductor chip having a CMOS semiconductor integrated circuit into which the measurement circuit 110 and the switch (SW) control circuit 120 are integrated. In the semiconductor industry, some types of such a hybrid semiconductor device are called a System-in-Package (SIP) or a multichip module (MCM).

Besides, the semiconductor integrated circuit formed as the load circuit 300 is not limited to a semiconductor chip into which the memory 310, the timer circuit 320, and the microcomputer (MCU) 330 are integrated. For example, it is obvious that the semiconductor integrated circuit formed as the load circuit 300 is also applicable to a semiconductor chip into which an IP core having a large-scale logic function such as a movie processor is integrated.

What is claimed is:
1. A semiconductor integrated circuit comprising:
a power supply circuit having a first input terminal, a second input terminal, and a output terminal,
wherein a main power supply voltage from a main power supply can be supplied to the first input terminal, wherein an auxiliary power supply voltage from an auxiliary power supply can be supplied to the second input terminal, wherein an output power supply voltage generated from the output terminal can be supplied to a load, wherein the power supply circuit includes a measurement circuit, a switch control circuit, and a switch circuit, wherein the switch circuit includes a first switch element coupled between the first input terminal and the output terminal and a second switch element coupled between the second input terminal and the output terminal, wherein the measurement circuit operates on the main power supply voltage supplied to the first input terminal and compares the main power supply voltage supplied to the first input terminal with the auxiliary power supply voltage supplied to the second input terminal, wherein the switch control circuit controls the first and second switch elements in the switch circuit in response to a determination signal of the measurement circuit, wherein, when the main power supply voltage supplied to the first input terminal is higher than the auxiliary power supply voltage supplied to the second input terminal, control is made in response to the determination signal of the measurement circuit so that the first and second switch elements in the switch circuit are placed in an ON state and an OFF state, respectively, and wherein, when the main power supply voltage supplied to the first input terminal is lower than the auxiliary power supply voltage supplied to the second input terminal, control is made in response to the determination signal of the measurement circuit so that the first and second switch elements in the switch circuit are placed in the OFF state and the ON state, respectively.

2. The semiconductor integrated circuit according to claim 1, wherein the measurement circuit includes a comparator that operates on the main power supply voltage supplied to the first input terminal and compares the main power supply voltage supplied to the first input terminal with the auxiliary power supply voltage supplied to the second input terminal, and wherein the determination signal of the measurement circuit is generated from an output terminal of the comparator.

3. The semiconductor integrated circuit according to claim 2, wherein the first switch element, which is coupled between the first input terminal and the output terminal and included in the switch circuit, has such a configuration as to prevent a backflow from the output terminal to the first input terminal, and wherein the second switch element, which is coupled between the second input terminal and the output terminal and included in the switch circuit, has such a configuration as to prevent a backflow from the output terminal to the second input terminal.

4. The semiconductor integrated circuit according to claim 3, wherein the first and second switch elements in the switch circuit include a first MOS transistor and a second MOS transistor, respectively, and wherein the configuration for preventing the backflow from the output terminal to the first input terminal and the configuration for preventing the backflow from the output terminal to the second input terminal respectively include a parasitic diode between the drain and substrate of the first MOS transistor and a parasitic diode between the drain and substrate of the second MOS transistor.

5. The semiconductor integrated circuit according to claim 4, wherein the load to which the output power supply voltage generated from the output terminal of the power supply circuit is supplied includes internal core circuits, and wherein, when the main power supply voltage supplied to the first input terminal is lower than the auxiliary power supply voltage supplied to the second input terminal, a load control signal supplied from the power supply circuit to the load in response to the determination signal of the measurement circuit performs control to place the internal core circuits in a low power consumption mode.

6. The semiconductor integrated circuit according to claim 2, wherein the switch control circuit includes a first inverter and a second inverter, the determination signal of the measurement circuit being supplied to the input terminal of the first inverter, the output signal of the first inverter being supplied to the input terminal of the second inverter, wherein the first MOS transistor of the first switch element in the switch circuit and the second MOS transistor of the second switch element in the switch circuit are P-channel MOS transistors, and wherein the gate of the first MOS transistor in the switch circuit and the gate of the second MOS transistor in the switch circuit are respectively driven by the output signal of the first inverter in the switch control circuit and the output signal of the second inverter in the switch control circuit.

7. The semiconductor integrated circuit according to claim 6, wherein when the main power supply voltage supplied to the first input terminal drops below an operating lower limit voltage of the comparator, the switch control circuit makes control so as to place the first and second switch elements of the switch circuit in the OFF state and the ON state, respectively.

8. The semiconductor integrated circuit according to claim 7, wherein the switch control circuit further includes an N-channel control MOS transistor whose drain-source path is coupled between the first inverter and a reference potential, and wherein when the main power supply voltage supplied to the first input terminal drops below the operating lower limit voltage of the comparator, control is made so as to place the N-channel control MOS transistor in the OFF state and place the first and second switch elements of the switch circuit in the OFF state and the ON state, respectively.

9. The semiconductor integrated circuit according to claim 7, wherein the measurement circuit further includes another comparator that operates on the main power supply voltage supplied to the first input terminal and detects that the main power supply voltage supplied to the first input terminal is lower than the operating lower limit voltage of the comparator, wherein the switch control circuit further includes a two-input AND gate having a first input terminal, a second input terminal, and an output terminal, wherein the output signal of the comparator in the measurement circuit and the output signal of the other comparator in the measurement circuit are respectively supplied to the first and second input terminals of the two-input AND gate of the switch control circuit, and wherein the output terminal of the two-input AND gate of the switch control circuit is coupled to the input terminal of the first inverter.

10. The semiconductor integrated circuit according to claim 9, wherein the power supply circuit further includes a level-shift circuit that is coupled between the measurement circuit and the switch control circuit, wherein the main power supply voltage supplied to the first input terminal of the power supply circuit and the output power supply voltage generated from the output terminal of the power supply circuit are supplied to the level-shift circuit as a power supply voltage, wherein the output signal of the comparator in the measurement circuit and the output signal of the other comparator in the measurement circuit are respectively supplied to first and second input terminals of the level-shift circuit, wherein first and second output terminals of the level-shift circuit are respectively coupled to the first and second input terminals of the two-input AND gate of the switch control circuit, wherein the level-shift circuit is capable of converting high-level input signals supplied respectively to the first and second input terminals of the level-shift circuit to high-level level-shift output signals, which are respectively generated at the first and second output terminals of the level-shift circuit, wherein the high-level input signals supplied respectively to the first and second input terminals of the level-shift circuit have the voltage level of the main power supply voltage supplied to the first input terminal, and wherein the high-level level-shift output signals generated respectively at the first and second output terminals of the level-shift circuit have the voltage level of the output power supply voltage generated from the output terminal of the power supply circuit.

11. The semiconductor integrated circuit according to claim 9, wherein the measurement circuit further includes voltage divider circuits and a reference voltage generation circuit, the voltage divider circuits being adapted to generate a divided voltage by dividing the main power supply voltage supplied to the first input terminal, the reference voltage generation circuit being adapted to generate a predetermined comparison reference voltage, and wherein the other comparator compares the divided voltage generated by each of the voltage divider circuits with the predetermined comparison reference voltage generated by the reference voltage generation circuit to detect that the main power supply voltage supplied to the first input terminal is dropped to a voltage lower than the operating lower limit voltage of the comparator.

12. The semiconductor integrated circuit according to claim 6, wherein the power supply circuit further includes a level-shift circuit that is coupled between the measurement circuit and the switch control circuit, wherein the main power supply voltage supplied to the first input terminal of the power supply circuit and the output power supply voltage generated from the output terminal of the power supply circuit are supplied to the level-shift circuit, wherein the output signal of the comparator of the measurement circuit is supplied to the first input terminal of the level-shift circuit, wherein the first output terminal of the level-shift circuit is coupled to the input terminal of the first inverter in the switch control circuit, wherein the level-shift circuit is capable of converting a high-level input signal supplied to the first input terminal of the level-shift circuit to a high-level level-shift output signal, which is generated at the first output terminal of the level-shift circuit, wherein the high-level input signal supplied to the first input terminal of the level-shift circuit has the voltage level of the main power supply voltage supplied to the first input terminal, and wherein the high-level level-shift output signal generated at the first output terminal of the level-shift circuit has the voltage level of the output power supply voltage generated from the output terminal of the power supply circuit.

13. The semiconductor integrated circuit according to claim 1, wherein the load is a semiconductor integrated circuit having internal core circuits, and wherein the semiconductor integrated circuit having the power supply circuit and the semiconductor integrated circuit having the internal core circuits of the load are formed in the same semiconductor chip.

14. The semiconductor integrated circuit according to claim 1, wherein the load is a semiconductor integrated circuit having internal core circuits, and wherein the semiconductor integrated circuit having the power supply circuit and the semiconductor integrated circuit having the internal core circuits of the load are respectively formed in separate semiconductor chips.

15. A method of operating a semiconductor integrated circuit including a power supply circuit having a first input terminal, a second input terminal, and an output terminal, wherein a main power supply voltage from a main power supply can be supplied to the first input terminal, wherein an auxiliary power supply voltage from an auxiliary power supply can be supplied to the second input terminal, wherein an output power supply voltage generated from the output terminal can be supplied to a load, wherein the power supply circuit includes a measurement circuit, a switch control circuit, and a switch circuit, and wherein the switch circuit includes a first switch element and a second switch element, the first switch element being coupled between the first input terminal and the output terminal, and the second switch element being coupled between the second input terminal and the output terminal, the method comprising the steps of:

causing the measurement circuit to operate on the main power supply voltage supplied to the first input terminal and compare the main power supply voltage supplied to the first input terminal with the auxiliary power supply voltage supplied to the second input terminal;

in response to a determination signal of the measurement circuit, causing the switch control circuit to control the first and second switch elements in the switch circuit;

making control in response to the determination signal of the measurement circuit so that the first and second switch elements in the switch circuit are placed in an ON state and an OFF state, respectively, when the main power supply voltage supplied to the first input terminal is higher than the auxiliary power supply voltage supplied to the second input terminal; and making control in response to the determination signal of the measurement circuit so that the first and second switch elements in the switch circuit are placed in the OFF state and the ON state, respectively, when the main power supply voltage supplied to the first input terminal is lower than the auxiliary power supply voltage supplied to the second input terminal.

16. The method according to claim 15, wherein the measurement circuit includes a comparator that operates on the main power supply voltage supplied to the first input terminal and compares the main power supply voltage supplied to the first input terminal with the auxiliary power supply voltage supplied to the second input terminal, and wherein the determination signal of the measurement circuit is generated from an output terminal of the comparator.

17. The method according to claim 16, wherein the first switch element, which is coupled between the first input terminal and the output terminal and included in the switch circuit has such a configuration as to prevent a backflow from the output terminal to the first input terminal, and wherein the second switch element, which is coupled between the second input terminal and the output terminal and included in the switch circuit has such a configuration as to prevent a backflow from the output terminal to the second input terminal.

18. The method according to claim 17, wherein the first and second switch elements in the switch circuit include a first MOS transistor and a second MOS transistor, respectively, and wherein the configuration for preventing the backflow from the output terminal to the first input terminal and the configuration for preventing the backflow from the output terminal to the second input terminal respectively include a parasitic diode between the drain and substrate of the first MOS transistor and a parasitic diode between the drain and substrate of the second MOS transistor.

19. The method according to claim 18, wherein the load to which the output power supply voltage generated from the output terminal of the power supply circuit is supplied includes internal core circuits, and wherein, when the main power supply voltage supplied to the first input terminal is lower than the auxiliary power supply voltage supplied to the second input terminal, a load control signal supplied from the power supply circuit to the load in response to the determination signal of the measurement circuit makes control to place the internal core circuits in a low power consumption mode.

20. The method according to claim 16, wherein the switch control circuit includes a first inverter and a second inverter, the determination signal of the measurement circuit being supplied to the input terminal of the first inverter, the output signal of the first inverter being supplied to the input terminal of the second inverter, wherein the first MOS transistor of the first switch element in the switch circuit and the second MOS transistor of the second switch element in the switch circuit are P-channel MOS transistors, and wherein the gate of the first MOS transistor in the switch circuit and the gate of the second MOS transistor in the switch circuit are respectively driven by the output signal of the first inverter in the switch control circuit and the output signal of the second inverter in the switch control circuit.

\* \* \* \* \*